(12) United States Patent
Wirth et al.

(10) Patent No.: US 8,835,937 B2
(45) Date of Patent: Sep. 16, 2014

(54) OPTOELECTRONIC COMPONENT, DEVICE COMPRISING A PLURALITY OF OPTOELECTRONIC COMPONENTS, AND METHOD FOR THE PRODUCTION OF AN OPTOELECTRONIC COMPONENT

(75) Inventors: Ralph Wirth, Mintraching-Auhof (DE); Herbert Brunner, Sinzing (DE); Stefan Illek, Donaustauf (DE); Dieter Eissler, Nittendorf / Etterzhausen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1634 days.

(21) Appl. No.: 10/588,167

(22) PCT Filed: Feb. 18, 2005

(86) PCT No.: PCT/DE2005/000281
§ 371 (c)(1),
(2), (4) Date: Dec. 2, 2008

(87) PCT Pub. No.: WO2005/081319
PCT Pub. Date: Sep. 1, 2005

(65) Prior Publication Data
US 2009/0065800 A1 Mar. 12, 2009

(30) Foreign Application Priority Data
Feb. 20, 2004 (DE) .................. 10 2004 008 853

(51) Int. Cl.
*H01L 33/00* (2010.01)
*H01L 31/0224* (2006.01)
*H01L 33/38* (2010.01)

(52) U.S. Cl.
CPC ..... *H01L 31/022408* (2013.01); *H01L 33/0079* (2013.01); *H01L 33/0095* (2013.01); *H01L 33/382* (2013.01); *H01L 31/022416* (2013.01)

USPC .......... 257/79; 257/98; 257/99; 257/E33.062; 257/E33.065; 257/E33.066; 257/E33.069; 438/22; 438/42

(58) Field of Classification Search
USPC ........................ 257/103, 99, 94, 96, 97, 98, 257/E33.055–E33.059, E33.062; 438/22, 438/26, 46, 212, 213
See application file for complete search history.

(56) References Cited

U.S. PATENT DOCUMENTS 5,905,276 A 5/1999 Manabe et al.
5,977,565 A * 11/1999 Ishikawa et al. ................ 257/81
(Continued)

FOREIGN PATENT DOCUMENTS

CN 1372329 10/2002 ............. H01L 33/00
DE 43 36 891 5/1994
(Continued)

OTHER PUBLICATIONS

Office Action for Japanese Patent Application No. 2006-553430 dated Jun. 16, 2011.
(Continued)

*Primary Examiner* — Ermias Woldegeorgis
(74) *Attorney, Agent, or Firm* — Fish & Richardson P.C.

(57) ABSTRACT

Disclosed is an optoelectronic component (1) comprising a semiconductor function region (2) with an active zone (400) and a lateral main direction of extension, said semiconductor function region including at least one opening (9, 27, 29) through the active zone, and there being disposed in the region of the opening a connecting conductor material (8) that is electrically isolated (10) from the active zone in at least in a subregion of the opening. Further disclosed are a method for producing such an optoelectronic component and a device comprising a plurality of optoelectronic components. The component and the device can be produced entirely on-wafer.

20 Claims, 20 Drawing Sheets

(56) References Cited

U.S. PATENT DOCUMENTS

| | | | |
|---|---|---|---|
| 6,066,861 A | 5/2000 | Höhn et al. | |
| RE36,747 E | 6/2000 | Manabe et al. | |
| 6,278,136 B1 * | 8/2001 | Nitta | 257/99 |
| 6,281,524 B1 | 8/2001 | Yamamoto et al. | |
| 6,633,120 B2 * | 10/2003 | Salam | 313/499 |
| 7,276,742 B2 | 10/2007 | Kohno et al. | |
| 2001/0042865 A1 * | 11/2001 | Oshio et al. | 257/100 |
| 2002/0117681 A1 | 8/2002 | Weeks et al. | |
| 2003/0044872 A1 | 3/2003 | Okuda et al. | |
| 2004/0012958 A1 | 1/2004 | Hashimoto et al. | |
| 2004/0217360 A1 * | 11/2004 | Negley | 257/79 |
| 2005/0012109 A1 * | 1/2005 | Kohno et al. | 257/103 |
| 2005/0056855 A1 | 3/2005 | Lin et al. | |

FOREIGN PATENT DOCUMENTS

| | | | |
|---|---|---|---|
| DE | 100 17336 | 10/2001 | |
| DE | 10 2004012219 | 6/2005 | |
| EP | 1 460 694 | 9/2004 | |
| JP | 2001-339100 | 12/2001 | H01L 33/00 |
| JP | 2002-64112 | 2/2002 | H01L 21/56 |
| JP | 03-177080 | 6/2003 | H01L 33/00 |
| JP | 2004-530289 | 9/2003 | H01L 21/28 |
| WO | WO 98/12757 | 3/1998 | |
| WO | WO 02/069410 | 9/2002 | H01L 33/00 |
| WO | WO 03/044872 | 5/2003 | |
| WO | WO 03044872 A1 * | 5/2003 | |

OTHER PUBLICATIONS

Notice of Allowance for Korean Patent Application No. 10-2012-7015400 dated Aug. 29, 2013 (3 pages).

Authorized officer: Warner, A., *International Search Report*, PCT/DE2005/000281, Jul. 18, 2005.

* cited by examiner

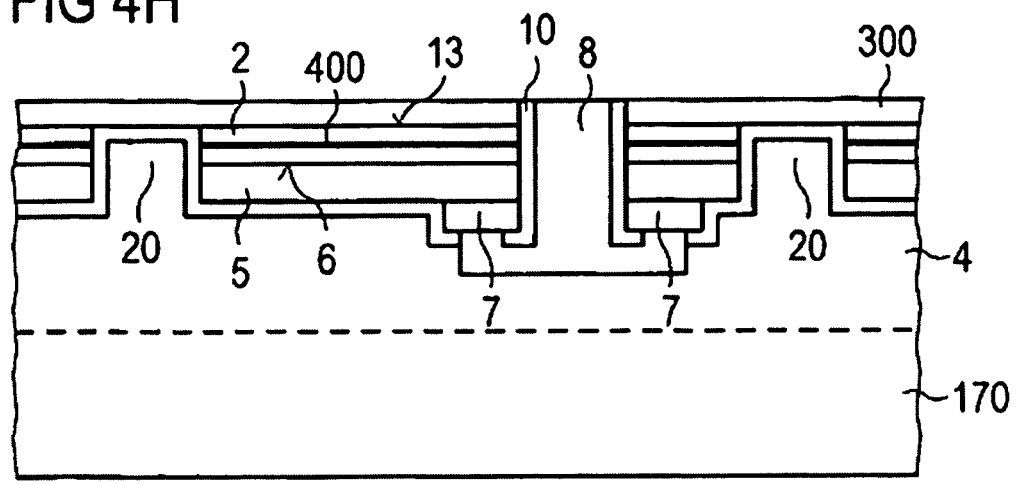
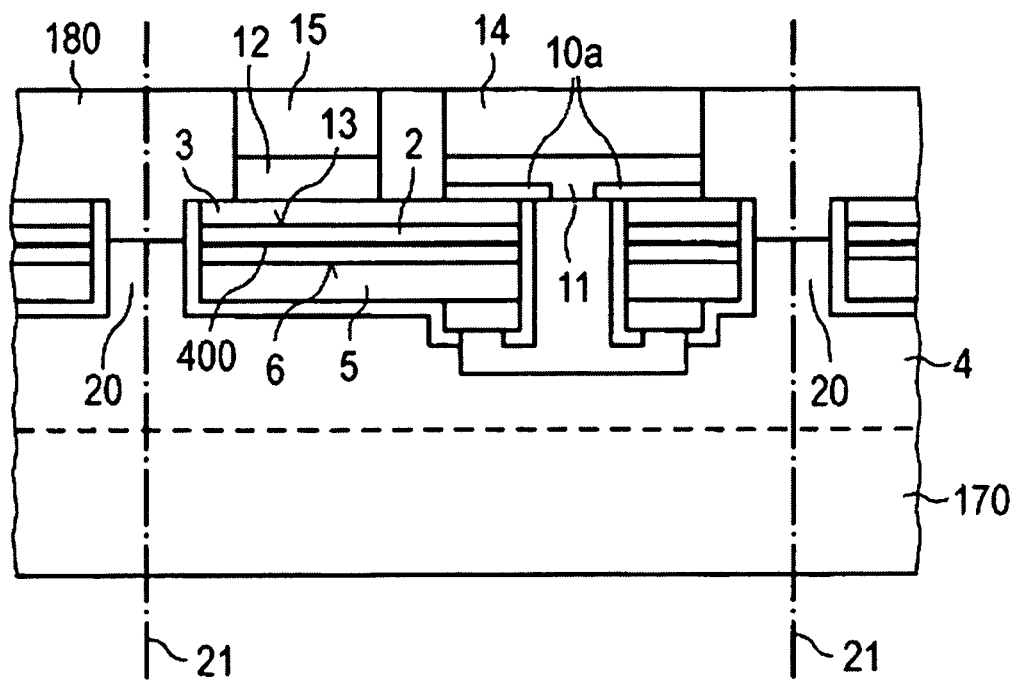

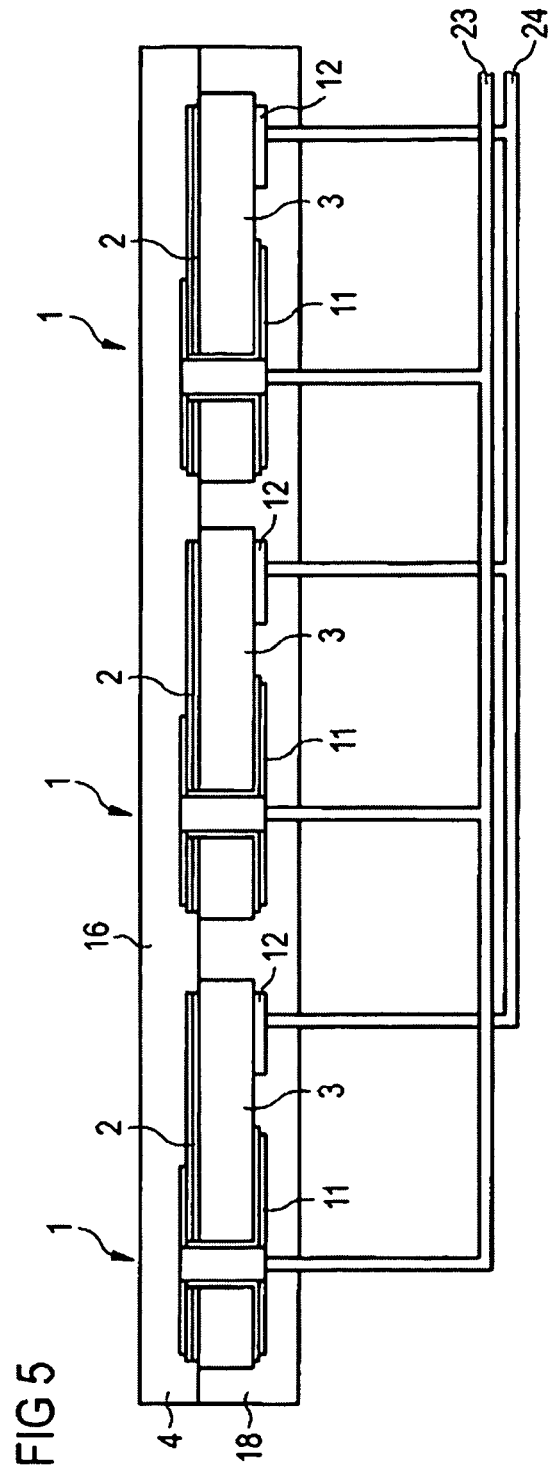

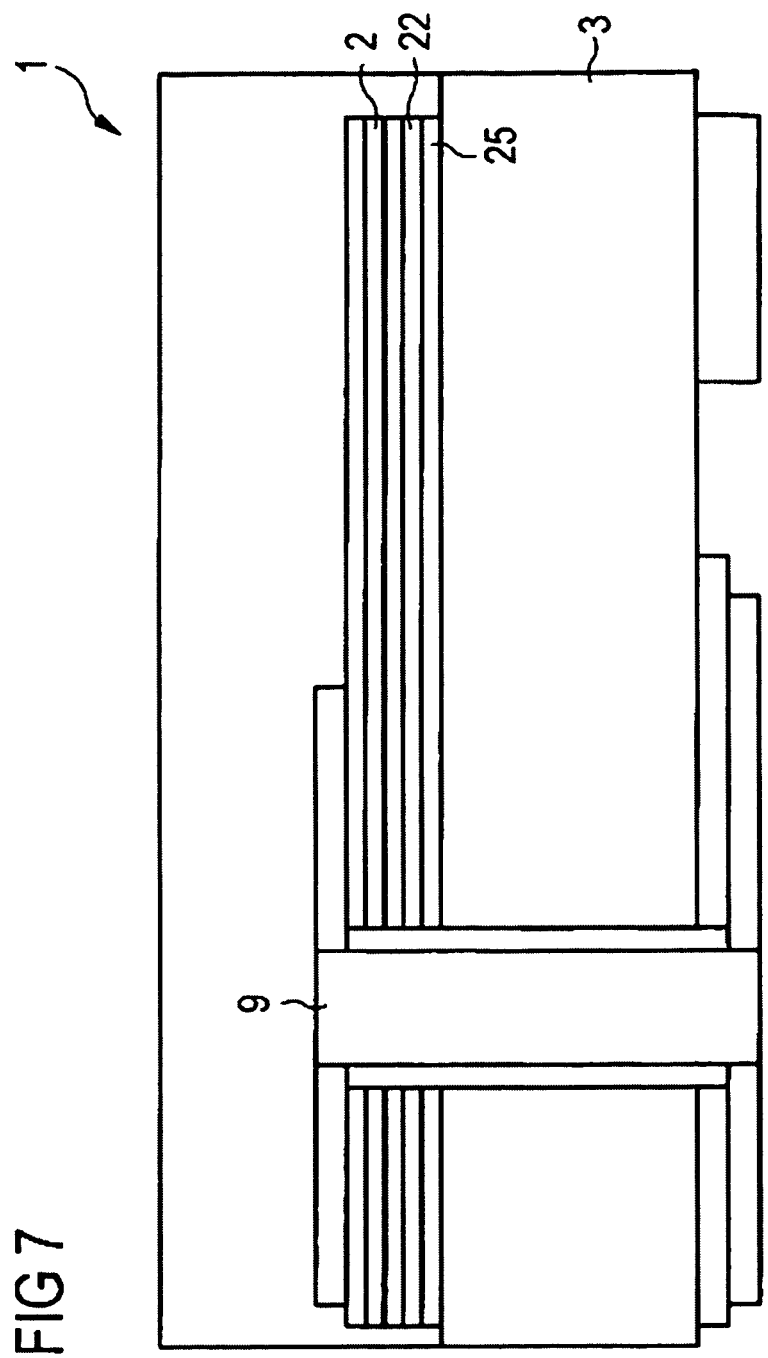

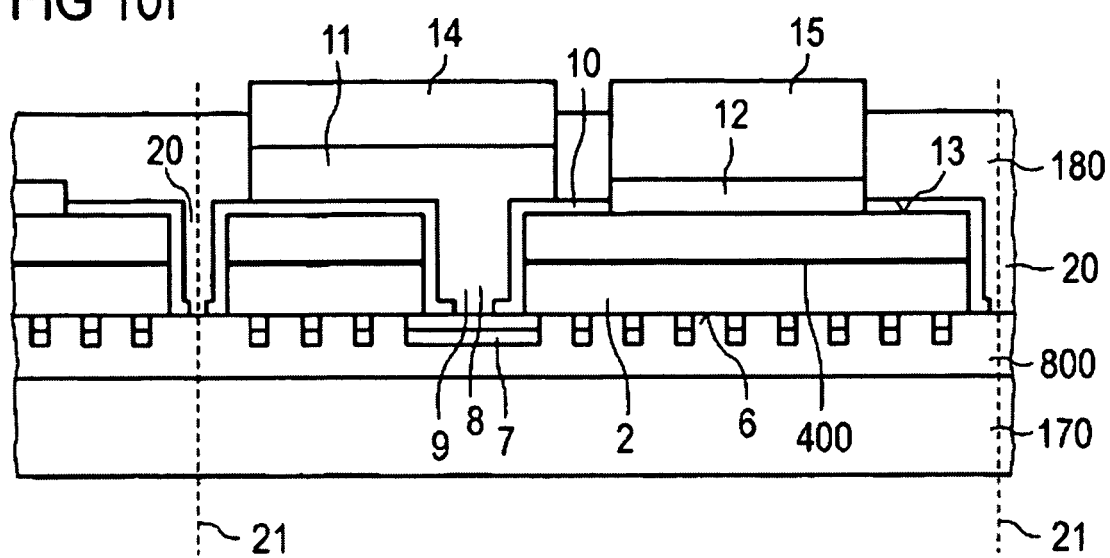

OPTOELECTRONIC COMPONENT, DEVICE COMPRISING A PLURALITY OF OPTOELECTRONIC COMPONENTS, AND METHOD FOR THE PRODUCTION OF AN OPTOELECTRONIC COMPONENT

CROSS-REFERENCE TO RELATED APPLICATIONS

This application is the National Stage of International Application No. PCT/DE2005/000281, filed on Feb.18, 2005, which claims the priority to German Patent Application Serial No.10 2004008853.5, filed on Feb.20, 2004. The contents of both applications are hereby incorporated by reference in their entireties.

FIELD OF THE INVENTION

The invention concerns an optoelectronic component comprising a semiconductor function region with an active zone and a lateral main direction of extension, a device comprising a plurality of optoelectronic components and a method for producing an optoelectronic component.

BACKGROUND OF THE INVENTION

The production of conventional optoelectronic components of this kind usually requires individual preparatory steps, such as, for example, placing the semiconductor function region or a semiconductor chip containing the semiconductor function region in a housing, contacting the semiconductor chip with external interconnects or bonding wires or overmolding the semiconductor chip with a protective envelope. Individual preparatory steps are usually cost-intensive compared to processing steps, which can be performed concurrently on a large number of items.

The semiconductor function regions can for example be created from a semiconductor layer sequence in the wafer composite, which contains the semiconductor layer sequence disposed on a carrier layer. The wafer composite is then usually singulated into semiconductor chips, which can be processed further in individual processing steps for optoelectronic components.

Furthermore, with conventional components it is often difficult to create very flat structures due to the use of bonding wire to contact the semiconductor function region. The arc of the bonding wire is often relatively high and can be a major determinant of the height of an optoelectronic component. In addition, a housing created separately from the semiconductor layer sequence will often have much larger spatial dimensions than the semiconductor layer sequence and can make it difficult to implement small optoelectronic components.

SUMMARY OF THE INVENTION

One object of the invention is to specify an optoelectronic component and a device comprising a plurality of optoelectronic components that can be produced in a simplified and low-cost manner, together with a simplified production method for optoelectronic components.

An inventive optoelectronic component comprises, in a first embodiment, a semiconductor function region with an active zone and a lateral direction of extension, said semiconductor function region being provided with at least one opening through the active zone and there being disposed in the region of the opening a connecting conductor material that is electrically isolated from the active zone in at least a subregion of the opening.

According to a further embodiment of the invention, the optoelectronic component comprises a semiconductor function region with an active zone and a lateral main direction of extension, the semiconductor function region being provided with a lateral side face bounding the active zone and there being disposed after the side face in the lateral direction a connecting conductor material that is electrically isolated from the active zone at least in a subregion of the side face. The side face can optionally bound the semiconductor function region laterally. The side face can in particular partially bound the semiconductor function region in the lateral direction. Furthermore, the side face can be fashioned as planar, i.e. substantially devoid of any bulges or indentations, particularly any depression in the lateral direction.

Preferably disposed after the semiconductor function region is a layer of a molding compound that can be implemented as self-supporting or mechanically load-bearing. This layer of molding compound can further be implemented in the form of an envelope, an encapsulating element or a stabilization layer, as will be described in more detail hereinafter.

An inventive component can advantageously be produced essentially or entirely on-wafer. The number of comparatively cost-intensive and/or labor-intensive individual processing steps can advantageously be reduced with an inventive optoelectronic component. Particularly advantageously, individual processing steps can be eliminated.

In the context of the invention, the term "wafer composite"[1] is considered to be a semiconductor layer sequence that is disposed on a carrier layer during the production of the optoelectronic component and is provided for creating a plurality of semiconductor function regions. During the production of the component, the semiconductor function regions are formed on the carrier layer from regions of the semiconductor layer sequence at least partially on-wafer. The carrier layer can be constituted by or comprise a growth substrate on which the semiconductor layer sequence was produced, for example epitaxially.

[1] TRANSLATOR'S NOTE: It should be noted that the German phrase for "on-wafer" is, literally, "e the wafer composite" (im Waferverbund). The term "wafer composite" is therefore implicit in the phrase "on-wafer" here.

It should be noted that in the context of the invention, the opening can also be an opening through the active zone, produced in the semiconductor layer sequence on-wafer during the fabrication of the optoelectronic component.

In particular, a contact structure serving to electrically contact the finished optoelectronic component can be produced at least partially, preferably entirely, on-wafer. The contacting of the optoelectronic component is preferably effected at least partially via the electrically conductive connecting conductor material, which can be disposed in the region of the opening through the active zone or in the region of the side face bounding the active zone right on-wafer. The connecting conductor material contains for example a metal, such as Au, Al, Ag, Ti, Pt, Sn or an alloy comprising at least one of these materials.

In a preferred embodiment of the invention, the connecting conductor material is spaced apart from the semiconductor function region in the lateral direction, particularly in the region of the active zone, thereby reducing the risk of a short circuit when the component is in operation. To this end, the connecting conductor material can be arranged in a, particularly lateral, edge region of the semiconductor function region and/or can be spaced apart from the side face.

In a further preferred embodiment of the invention, the semiconductor function region is provided with at least one depression in the lateral direction, which particularly preferably at least partially surrounds the opening through the active zone. In particular, the opening can be configured as a depression in the semiconductor function region in the lateral direction and/or the side face can be provided with a depression in the lateral direction.

According to the invention, the opening can be configured particularly in the form of a recess that does not penetrate all the way through the semiconductor function region or a gap that does penetrate all the way through the semiconductor function region, in which case the recess or gap can at least partially, preferably completely, surround or constitute the opening through the active zone.

The opening preferably extends in the vertical direction, substantially perpendicularly to the lateral main direction of extension of the semiconductor function region, through the entire semiconductor function region. For example, the opening is configured for this purpose as a gap in the semiconductor function region.

The connecting conductor material is preferably at least partially electrically isolated from the active zone by an isolation material. The isolation material is preferably disposed, particularly directly, against the active zone in the region of the opening or side face and contains for example a silicon nitride, such as SiN or $Si_3N_4$, a silicon oxide, such as SiO or $SiO_2$, or a silicon oxynitride, such as SiON.

The isolation material preferably so lines the opening, particularly the depression, or the isolation material is preferably so disposed, particularly directly, on the side face, that the active zone is electrically isolated from the connecting conductor material by the isolation material. The risk of the active zone short circuiting across the connecting conductor material can be reduced in this fashion.

Particularly preferably, at least nearly the entire wall of the opening is covered with the isolation material or at least nearly the entire side face is coated with the isolation material, thereby further reducing the risk of a short-circuit when the component is in operation.

In addition, the connecting conductor material is preferably disposed over nearly the entire vertical extent of the semiconductor function region, which can advantageously simplify the creation of the contact structure during the production of such an optoelectronic component on-wafer.

A connecting conductor material that extends in the vertical direction along the entire semiconductor function region, particularly in combination with a suitably arranged isolation material, allows the optoelectronic component or its semiconductor function region to be contacted electrically in the vertical direction over the region of the active zone without increasing the risk of short circuits. This part of the contact structure of the optoelectronic component can advantageously be produced on-wafer.

In a further preferred embodiment of the invention, the semiconductor function region is provided with a first main face and a second main face located oppositely from the first main face relative to the active zone, the semiconductor function region preferably being electrically conductively connected to the connecting conductor material on the side comprising the first main face.

This can be effected for example via a first contact that is conductively connected to the semiconductor function region and to the connecting conductor material from the first main face side of the semiconductor function region. Such a first contact, for example containing a metal such as Au, Al, Ag, Pt, Ti, Sn or an alloy comprising at least one of these materials, such as AuGe, can also advantageously be produced on-wafer.

By providing a conductive connection between the connecting conductor material, which can extend in the region of the opening, in the depression or along the edge region of the semiconductor function region, particularly of the side face, in the vertical direction over the vertical extent of the semiconductor function region, and the first contact, disposed on the first main face of the semiconductor function region, it becomes possible to electrically connect the first main face of the semiconductor function region from the second main face side.

A connecting conductor, formed of the connecting conductor material, and the first contact can optionally be fashioned in one piece, particularly using the exact same material.

In an advantageous improvement of the invention, the connecting conductor material is electrically isolated from the second main face of the semiconductor function region. The risk of short circuits can be further reduced in this way.

In a further preferred embodiment of the invention, disposed on the second main face side is a second contact, for example containing a metal, such as Au, Al, Ag, Ti, Pt, Sn or an alloy comprising at least one of these materials, such as AuGe, which is electrically conductively connected to the semiconductor function region on the second main face side, particularly for purposes of current injection.

The optoelectronic component can be electrically connected via the first and the second contact. In particular, the optoelectronic component can be configured as an SMD component (SMD: Surface Mountable Device). The component can also be provided for a hybrid module.

A conductive connection between the first contact and the connecting conductor material, which can extend from the first to the second main face, forms with the second contact a contact structure that facilitates contacting the optoelectronic component from the second main face.

Electrically contacting a component of this kind by means of the first and second contacts advantageously eliminates the need for bonding wires, thereby advantageously reducing the height of the component and facilitating the creation of smaller components. Furthermore, such a contact structure advantageously can be created on-wafer.

It should be noted that the number of contacts is, of course, not limited to two, but rather a plurality of contacts or contact pairs can also optionally be provided.

The optoelectronic component, particularly the semiconductor function region with the active zone, can be configured in the manner of a radiation-emitting or radiation-receiving component. The active zone can accordingly be configured for generating electroluminescent radiation or for signal generation via charge carriers produced by incident radiation in the active zone. The semiconductor function region can for example be configured in the manner of an LED chip, a laser diode chip with a lateral or vertical emission direction, or a photodiode chip. The first and second contacts are then preferably fashioned according to the two poles of a diode contact.

The semiconductor function region, particularly the active zone, preferably contains at least one III-V semiconductor material, for example a material from a III-V semiconductor material system, such as $In_xGa_yAl_{1-x-y}P$, $In_xGa_yAl_{1-x-y}N$ or $In_xGa_yAl_{1-x-y}As$, where in each case $0 \leq x \leq 1$, $0 \leq y \leq 1$ and $x+y \leq 1$.

The optoelectronic component is preferably configured for radiation in the ultraviolet, visible or infrared region of the spectrum.

The material system $In_xGa_yAl_{1-x-y}N$, for example, is particularly well suited for radiation from the ultraviolet to the green region of the spectrum, while $In_xGa_yAl_{1-x-y}P$, for example, is particularly well suited for radiation from the green-yellow to the red region and $In_xGa_yAl_{1-x-y}As$ for radiation in the infrared region.

The component can also be based on other materials that are not included in a III-v material system. For example, the semiconductor function region can contain Si, particularly for photodiodes, or a II-VI semiconductor material, or can be based on Si or II-VI semiconductor materials. With a III-V semiconductor material, however, it is easier to attain relatively high internal quantum efficiencies in the component.

Since the active zone cannot generate or receive radiation in the region of the opening, the opening in the optoelectronic component preferably has such minimal dimensions laterally that the area of the active zone available for generating or receiving radiation is as large as possible. This can be achieved by suitably configuring the opening.

The opening and/or the depression in the semiconductor function region is preferably dimensioned laterally such that the connecting conductor material or a connecting conductor comprising the connecting conductor material has a conductivity that is adapted to the particular configuration of the semiconductor function region. High-output components often entail higher conductivities than relatively low-output components. A lateral dimension of the opening or depression or of the connecting conductor material can range from the nanometer to the micrometer scale. A lateral dimension is for example 100 μm, preferably 50 μm or less, e.g. 100 nm or 10 μm.

A sufficiently high conductivity can optionally also be obtained by means of a plurality of openings with connecting conductor material disposed in them, or a suitably adapted combination of dimensioning and number of openings.

In a further preferred embodiment of the invention, the optoelectronic component is provided with a window, disposed after the semiconductor function region, that is preferably transparent to the radiation to be received or generated by the active zone and/or lies in the beam path of that radiation. The window can be provided to couple radiation into or out of the optoelectronic component.

In a further preferred embodiment of the invention, the optoelectronic component is provided with an envelope that at least partially forms around or envelops the semiconductor function region. The semiconductor function region can in particular be embedded in the envelope. The envelope can be part of the window and/or constitute the window. The envelope advantageously protects the semiconductor function region against harmful external influences, such as moisture, for example.

The envelope is preferably implemented as radiation-transparent to a radiation to be generated or received by the active zone. This advantageously reduces any undesirable absorption of radiation in the envelope.

Further, the material of the envelope is preferably resistant to the radiation that is to be generated by or is incident on the active zone. The risk of efficiency-lowering discoloration or softening of the envelope can be reduced in this way.

In a further advantageous improvement, the semiconductor function region, particularly the active zone, is surrounded by an encapsulation that is preferably—at least during the activation and/or operation of the component—substantially tight, particularly hermetically tight, against harmful external influences such as moisture. The encapsulation, which can comprise the envelope and optionally one or more additional encapsulating elements, preferably completely surrounds the semiconductor function region or active zone and advantageously increases the protection of the semiconductor function region or the active zone against harmful external influences.

The encapsulation is also preferably configured such that the contacts of the optoelectronic component are electrically connectable preferably through the encapsulation. External interconnects or external interconnecting means can therefore be part of the encapsulation. In particular, the optoelectronic component can be electrically conductively connected to conductive traces of a printed circuit board by means of the external interconnects. The component is preferably connected to the conductive traces via a solder connection.

The encapsulation or the encapsulating elements are preferably configured at least in part such that the region between the encapsulation or the encapsulating element and the active zone, particularly in the beam path of the radiation to be generated or received, is substantially devoid of cavities. This reduces the risk of cavity-induced excessive jumps in refractive index, with proportionately high reflection losses at interfaces during the coupling of radiation out of or into the component.

Elements participating in the encapsulation, such as for example the envelope and/or the window, can also advantageously be formed on-wafer. Particularly advantageously, the entire encapsulation can be produced on-wafer.

In a preferred embodiment of the invention, the encapsulation is so mechanically stable as to eliminate the need for an additional housing to protect the semiconductor function region and facilitate the creation of very small optoelectronic components in which the semiconductor function region is protectively encapsulated, preferably on all sides.

The encapsulation or the elements of the encapsulation, such as for example the envelope, are preferably implemented at least in part so that they are at least temporarily stable against high temperatures, for example above 200° C., preferably up to 300° C., of the kind that occur during the soldering of the interconnects of the component, in order to avoid significantly increasing the risk of damage to the semiconductor function region and/or the envelope due to a soldering process.

In a further preferred embodiment of the invention, disposed after the semiconductor function region is at least one absorbing material or phosphor. The phosphor or absorbing material can be provided or disposed, preferably directly, in, at or on the window, the envelope or the semiconductor function region. The absorbing material or the phosphor is preferably implemented as powder.

An absorbing material such as an organic dye can be provided for example in a component configured as a radiation-receiving component, to act as a filtering material and thereby influence the sensitivity, e.g. the spectral sensitivity distribution, of the radiation detector by virtue of absorption at suitable, particularly specified, wavelengths, from a radiation incident on the semiconductor function region. Advantageously, for example the spectral sensitivity distribution of an optoelectronic component configured as a radiation detector can be adjusted deliberately in this way.

In the case of an optoelectronic component configured as an emitter, the phosphor can preferably absorb radiation of a wavelength $\lambda_1$ generated by the active zone and reemit it as radiation of a wavelength $\lambda_2$. Wavelength $\lambda_2$ is preferably greater than wavelength $\lambda_1$. Such an optoelectronic component can generate mixed-color light, particularly white light, whose color involves a mixture of radiation of wavelengths $\lambda_1$ and $\lambda_2$. Thus, a phosphor of this kind at least partially converts the radiation of wavelength $\lambda_1$ into radiation of wavelength $\lambda_2$ and is therefore often referred to as a conversion material, particularly a luminescence conversion material.

Substances that can be used as luminescence conversion materials in this case are inorganic phosphors, doped garnets, Ce- or Tb-activated garnets, such as (for example YAG:Ce, TAG:Ce, TbYAG:Ce), alkaline earth sulfates or organic dyes. Suitable luminescence conversion materials are described for example in the document WO98/12757, whose content in this regard is hereby incorporated by reference.

Particularly suitable for generating white light is a phosphor, particularly a YAG-based phosphor, which converts radiation generated in the semiconductor function region, for example in ultraviolet or blue region of the spectrum, for example into the yellow region of the spectrum. The converted and unconverted fractions of radiation can be mixed together to produce mixed-color, particularly white, light.

In a preferred embodiment, the average particle size of the luminescence conversion material in a powder that is used can be no more than 30 μm. An average particle size of between 2 and 6 μm has proven especially advantageous in this regard. It has been found that luminescence conversion can take place particularly efficiently with this particle size.

The conversion material is preferably disposed as closely as possible to the active zone. The efficiency of the conversion can be increased in this way, since the intensity of the radiation generated by the active zone decreases quadratically with increasing distance from the active zone. This also makes it easier to optimize the extent of the color locus of the mixed-color radiation or its dependence on viewing angle. Converting the radiation near the active zone into a low-energy radiation of greater wavelength can have a protective effect on an element surrounding or disposed after the conversion material, such as the envelope. The risk of radiation-induced discoloration of the envelope material by conversion in the vicinity of the active zone can be reduced in this way.

In a further preferred embodiment, the phosphor is disposed, particularly directly, on the semiconductor function region. The phosphor can be implemented in the form of a phosphor layer. This facilitates particularly efficient luminescence conversion near the active zone. The phosphor is preferably applied on-wafer to the semiconductor layer sequence or to the semiconductor function regions deriving from the semiconductor layer sequence. The phosphor can in particular be applied by means of electrostatic forces. This advantageously applies analogously to the absorbing material.

In a further advantageous embodiment of the invention, disposed after the semiconductor function region are one or more optical elements that advantageously influence the efficiency or the radiation or reception characteristic of the component. This optical element can be fashioned for example as a lens for beam shaping. The optical element can further be fashioned as a filtering or scattering element.

In addition, the optical element can be fashioned as an antireflection layer or coating. Reflection losses caused by refractive index jumps can advantageously be reduced by means of an antireflection coating. One or more λ/4 layers are particularly well suited for this purpose. For example, the antireflection coating can contain the materials listed above for the isolation material. These materials can in particular be identical and/or the antireflection coating and the isolation material can be configured as integrated into one element. An antireflection coating can be disposed between the envelope and the semiconductor function region and/or between the envelope and the window.

In an advantageous improvement of the invention, the optical element is configured in the envelope or the window, applied to one or the other thereof or directly in contact with one or the other thereof.

The optical element, particularly a lens structure or a scattering structure, can for example be structured into the envelope material or window material or formed therefrom. This can be accomplished for example by punching or by means of an etching process.

Furthermore, the scattering or filtering element, for example in the form of scattering or filtering particles, can be disposed in the envelope or the window.

Moreover, the optical element can also be glued, vapor-deposited or sputtered onto the envelope material or the semiconductor function region. Gluing is particularly suitable for optical elements designed for beam forming, whereas sputtering or vapor deposition is particularly suitable for an antireflection coating.

The optical element is preferably created on-wafer.

In a further preferred embodiment of the invention, the semiconductor function region is disposed on a carrier. This carrier can be constituted by or can comprise a portion of the growth substrate of the semiconductor layer sequence from which the semiconductor function region is derived during the production of the component, or a portion of another carrier layer that is different from the growth substrate and on which the semiconductor layer sequence is disposed, for example by a wafer bonding process, during processing or production. In the latter case the growth substrate is removed, preferably after the semiconductor layer sequence or semiconductor function regions have been disposed on the carrier layer. The carrier preferably supports and stabilizes the semiconductor function region mechanically. In particular, the semiconductor function region can be disposed on one side of the carrier.

The connecting conductor material preferably extends at least to the side of the carrier located oppositely from the semiconductor function region. This makes it easier for the optoelectronic component to be electrically connectable from the side of the carrier located oppositely from the semiconductor function region.

If the connecting conductor material is disposed at least partially in the opening, then the opening, which is configured for example as a lateral depression, preferably extends to the side of the carrier located oppositely from the semiconductor function region. If the carrier is involved in the electrical contacting of the component, then the latter is preferably implemented as electrically conductive. The carrier can for example contain a suitable semiconductor material that can be doped to increase its conductivity.

In a further preferred embodiment of the optoelectronic component, a mirror layer is disposed after the active zone and/or the semiconductor function region. Such a mirror layer can for example be integrated into the semiconductor function region as a Bragg mirror or can be configured as a metal-containing, particularly metallic, mirror layer, for example containing Au, Al, Ag, Pt, Ti or alloys comprising at least one of these metals, such as AuGe. Particularly preferably, the mirror layer is disposed between the carrier and the active zone and/or on the semiconductor function region.

The mirror layer is preferably implemented as electrically conductive and can be involved in the contacting of the component. To this end, the mirror layer is usefully connected electrically conductively to the semiconductor function region.

The mirror layer is preferably configured as reflective of a radiation to be received or generated by the active zone.

Advantageously, the mirror layer increases the efficiency of the optoelectronic component, for example by reducing the absorption of radiation in the carrier or favorably influencing the radiation or reception characteristic of the optoelectronic component.

The mirror layer can with particular advantage be produced on the semiconductor layer sequence or semiconductor function region right on-wafer, for example, by being grown, like the Bragg mirror, along with the semiconductor layer sequence and integrated therein; or by being applied subsequently, for example by vapor deposition or sputtering, as in the case of a metallic mirror layer.

The mirror layer can optionally include a first submirror layer monolithically integrated into the semiconductor layer sequence or semiconductor function region, and a second, particularly metal-containing, submirror layer disposed on the semiconductor layer sequence or semiconductor function regions on the side comprising the integrated submirror layer. An interlayer preferably electrically conductively connected to the sublayers is preferably disposed between the submirror layers. An interlayer containing a radiation-transparent conductive oxide, particularly a metal oxide, such as a zinc oxide, an indium tin oxide or a tin oxide, is particularly suitable. The interlayer can serve to optimize the electrical contact of the metal-containing submirror layer to the integrated submirror layer.

If the growth substrate of the semiconductor layer sequence is removed during the production of the optoelectronic component, particularly a component with a metal-containing mirror layer, then such components whose production involves removing the growth substrate are also referred to as thin-film components. A thin-film component with a metal-containing mirror can in particular have a substantially cosinusoidal radiation characteristic analogous to that of a Lambertian radiator.

In an advantageous improvement of the invention, the encapsulation or at least an element of the encapsulation is implemented such that the semiconductor function region is mechanically stabilized. This stabilizing action advantageously eliminates the need for a carrier to stabilize the semiconductor function region, thereby simplifying the creation of very thin optoelectronic components. The carrier can therefore particularly be thinned down or removed.

An inventive device with a plurality of optoelectronic components comprises a plurality of inventive optoelectronic components of the aforesaid kind, the semiconductor function regions preferably being arranged at least partially side by side in the lateral direction. The lateral side by side arrangement advantageously corresponds to the arrangement of the semiconductor function regions, which result from corresponding structuring of a semiconductor layer sequence in the semiconductor function regions on a carrier layer on-wafer. The device is particularly well suited for on-wafer production.

In a preferred embodiment, the device is provided with an envelope that at least partially envelops or forms around the semiconductor function regions. The envelope is preferably configured in one piece. The envelope can also advantageously be formed on-wafer. The envelope can in particular be formed as described hereinabove.

In a further preferred embodiment, the semiconductor function regions are mechanically stabilized by a stabilization layer. The semiconductor function regions are preferably stabilized in an arrangement dictated by the arrangement of the semiconductor function regions of the device in the wafer composite, particularly on a planar carrier layer.

In an advantageous improvement of the device, the stabilization layer includes the envelope and/or the window, and/or the stabilization layer is substantially identical to the envelope, so that the envelope can simultaneously have a protective effect on the semiconductor function regions and a stabilizing effect. The envelope can thus be implemented as a stabilization layer or part of the stabilization layer.

In an inventive method for producing an optoelectronic component, a wafer composite comprising a semiconductor layer sequence that is disposed on a carrier layer and has an active zone and a lateral main direction of extension is first prepared. The semiconductor layer sequence is then structured such that at least one opening through the active zone is produced or at least one lateral side face bounding the active zone in the lateral direction is formed, after which a connecting conductor material is disposed in the region of the opening or side face in such a way that the active zone is electrically isolated from the connecting conductor material at least in a subregion of the opening or side face. This is followed by singulation into optoelectronic components whose electrical contacting is effected at least partially via the connecting conductor material.

Such a method has the advantage that optoelectronic components, including their contact structure, can be produced at least in part, preferably entirely, inexpensively on-wafer. The fact of the active zone being electrically isolated from the connecting conductor material, for example by suitably arranging the connecting conductor material relative to the active zone, as for example at a distance from the active zone, makes it possible to reduce the risk that the active zone will short circuit through the connecting conductor material. Advantageously, the contact structure of the component can be configured such that the optoelectronic component is free of wire bonds or can be contacted without bonding wires.

The carrier layer can contain the growth substrate of the semiconductor layer sequence on which the semiconductor layer sequence was produced, preferably epitaxially, or it can be different from the growth substrate of the semiconductor layer sequence. In the latter case the growth substrate is removed, preferably after the semiconductor layer sequence has been put in place, particularly with its side opposite from the growth substrate disposed on the carrier layer.

The active zone is preferably electrically isolated from the connecting conductor material by means of an isolation material. The isolation material, for example containing SiN or another of the above-cited materials, is in addition preferably disposed at least partially in the region of the opening or side face. Particularly preferably, the isolation material is disposed directly against the active zone and/or the connecting conductor material is electrically isolated from the active zone by the isolation material disposed between the active zone and the connecting conductor material. The risk of a short circuit of the active zone is further reduced in this fashion. The isolation material is preferably applied before the connecting conductor material and/or the connecting conductor material directly abuts the isolation material. The isolation material can be applied for example by vapor deposition, e.g. in a PVD process, such as sputtering, or in a CVD process, such as PECVD.

In a preferred embodiment of the method, the semiconductor layer sequence is provided in the lateral direction with at least one depression that preferably at least partially surrounds the opening through the active zone. The opening can optionally be configured as a depression in the semiconductor layer sequence in the lateral direction.

Further preferably, a wall of the opening is at least partially covered with the isolation material.

In accordance with a further preferred embodiment, the electrically conductive connecting conductor material is arranged at least partially in the opening, particularly in the depression. The opening can thus determine the contract structure of the optoelectronic component.

Furthermore, the opening preferably extends in the vertical direction perpendicularly to the lateral main direction of extension of the semiconductor layer sequence, particularly through the entire semiconductor layer sequence. The opening preferably extends to or into the carrier layer. Particularly preferably, the opening extends through the entire carrier layer. The opening can thus be configured particularly as a gap extending through the semiconductor layer sequence and/or into or through the carrier layer, or it can be fashioned as a gap in the semiconductor layer sequence. In particular, in the region of the semiconductor layer sequence the gap can be bounded in the lateral direction at least partially, preferably completely, by the semiconductor layer sequence. The semiconductor layer sequence can thus completely surround the opening in the lateral direction.

In a further preferred embodiment of the method, the semiconductor layer sequence is structured so as to yield a plurality of semiconductor function regions, particularly separated spatially from one another in the lateral direction by interspaces. Particularly preferably, this structuring of the semiconductor layer sequence takes place in a method step that includes the creation of the opening or side face, particularly before the connecting conductor material is put in place. The structuring in the semiconductor function regions can be performed before or after the creation of the opening or side face.

The semiconductor function regions are preferably at least partially provided with an opening through the active zone or a side face bounding the active zone in the lateral direction. To this end, during the structuring of the semiconductor layer sequence a plurality of openings is usefully produced for a plurality of semiconductor function regions. The opening can in particular be configured as a gap made in the semiconductor function region and preferably bounded laterally, in the region of the semiconductor function region, at least partially, preferably entirely, by the semiconductor function region. The semiconductor function region can therefore completely surround the opening in the lateral direction.

In a preferred embodiment, a plurality of openings through the active zone is produced, a plurality of semiconductor function regions each being provided with at least one opening through the active zone.

In a further preferred embodiment, a plurality of semiconductor function regions each comprise in the lateral direction at least one depression that at least partially surrounds the opening, or, if there is a plurality of semiconductor function regions, the opening is configured as a depression in the lateral direction in the semiconductor function region concerned.

In a further preferred embodiment, a plurality of semiconductor function regions each comprise at least one lateral side face bounding the active zone of the semiconductor function region concerned. The side face preferably bounds the particular semiconductor function region in the lateral direction. Particularly the entire semiconductor function region can be bounded by such side faces.

This side face or these side faces can for example be formed in the semiconductor function regions during the structuring of the semiconductor layer sequence. The side face can in particular border on an interspace disposed between two semiconductor function regions.

The connecting conductor material is preferably disposed after the side face in the lateral direction in such fashion that the connecting conductor material is electrically isolated from the active zone at least in a subregion of the side face.

In a further preferred embodiment of the invention, the isolation material is disposed, particularly directly, at the side face.

The connecting conductor material preferably extends in the vertical direction past the region of the active zone and/or is kept apart from and/or isolated from the active zone, for example by means of the isolation material, which can be disposed between the connecting conductor material and the side face or the semiconductor function region.

In a further preferred embodiment, a first electrical contact is applied to the side of the semiconductor layer sequence or semiconductor function regions facing away from the carrier layer. The first electrical contact advantageously facilitates the creation on-wafer of the contact structure of the optoelectronic component to be produced. The first electrical contact can be provided before or after the opening or side face is created. For example, substantially every semiconductor function region can be provided with such a first contact.

Furthermore, a plurality of first contacts can optionally be provided or formed on the semiconductor layer sequence. This is preferably done in such a way that a first contact of this kind is assigned to substantially every region of the semiconductor layer sequence where a semiconductor function region is to be formed from the semiconductor layer sequence.

In a further preferred embodiment, the connecting conductor material is disposed in the region of the opening or side face in such a way that a, particularly direct, electrically conductive connection is formed between the connecting conductor material and the first contact. The connecting conductor material and the first contact can in particular be in direct mechanical contact.

In a further preferred embodiment, the opening or side face is configured such that the first contact is electrically connectable, over the region of the opening or the region of the side face, from the side of the semiconductor layer sequence or semiconductor function region located oppositely from the first contact, or such that the first contact is at least partially exposed, i.e., the first contact, particularly in the vertical direction, is not covered by the semiconductor layer sequence or semiconductor function region. It is expedient in this case to provide the first contact before the opening or side face is formed. To form the opening or side face, a region of the semiconductor layer sequence that covers the first contact can then be removed, so that the first contact is exposed and can be connected electrically, particularly by means of the connecting conductor material, from the side of the semiconductor layer sequence or semiconductor function region located oppositely from the first contact. In particular, the first contact can, particularly completely, overlap the opening in the lateral direction. To this end, the first contact preferably has a lateral extent greater than that of the opening.

In a further preferred embodiment of the method, a stabilization layer is disposed after the unstructured semiconductor layer sequence or semiconductor function regions as viewed from the side thereof facing away from the carrier layer. The stabilization layer is preferably applied to the semiconductor layer sequence or semiconductor function regions. Furthermore, the stabilization layer can be disposed after the semiconductor layer sequence or semiconductor function regions, optionally with the use of a suitable adhesive layer or interlayer.

The stabilization layer is preferably configured as self-supporting and stabilizes the semiconductor layer sequence or semiconductor function regions mechanically. In addition, the stabilization layer can mechanically stably interconnect the semiconductor function regions.

Such a stabilization layer can advantageously stabilize the wafer composite mechanically in such fashion that the carrier layer can be eliminated or thinned. The carrier layer can be at least partially thinned, for example by etching or grinding, or, particularly completely, removed.

This simplifies the production of very thin optoelectronic components, whose semiconductor function region includes substantially only the active zone in the extreme case.

In particular, the semiconductor layer sequence can be structured into a plurality of semiconductor function regions after the partial, particularly complete, removal of, or after the thinning of, the carrier layer. Mechanical stability is preferably assured in this case by the stabilization layer provided earlier.

Furthermore, by optionally repeatedly applying and optionally removing various stabilization layers of this kind, it can be made possible to structure a semiconductor layer sequence on many sides, preferably on all sides, on a carrier layer on-wafer.

Particularly preferably, the stabilization layer is implemented as photostructurizable, which can simplify further processing. The stabilization layer preferably contains a photostructurizable resist for this purpose.

In a further preferred embodiment, the stabilization layer is disposed after the semiconductor layer sequence or semiconductor function regions before the opening or side face is created. The opening or side face is then preferably created on the semiconductor layer sequence or semiconductor function regions from the side located oppositely from the stabilization layer. For this purpose the carrier layer is preferably removed, particularly regionally or completely, or the creation of the opening or side face is accompanied by the simultaneous, suitable, particularly regional, removal of the carrier layer.

Due to the mechanically stabilizing effect of the stabilization layer, the carrier layer can be removed regionally or completely without increasing the risk of damaging the semiconductor layer sequence or semiconductor function regions.

In an advantageous improvement, the carrier layer is removed, preferably completely, at least in a subregion, and the opening or side face is created in the semiconductor layer sequence or semiconductor function regions working from the side facing away from the stabilization layer, particularly in the region from which the carrier layer is removed.

In a further preferred embodiment of the method, the stabilization layer at least partially envelops and/or forms around the semiconductor function regions. Advantageous protection of the semiconductor function regions against harmful external influences, particularly in their edge regions, can be achieved in this way during the very production of the optoelectronic components.

In a further preferred embodiment, the opening or side face is formed in the semiconductor layer sequence or semiconductor function regions from the side opposite from the carrier layer. To this end, for example the semiconductor layer sequence or semiconductor function regions can be suitably structured by etching from the side opposite from the carrier layer. This can take place before, after or concurrently with the creation of the semiconductor function regions. The mechanical stability of the composite is advantageously ensured by the carrier layer in this case.

In an advantageous improvement, the stabilization layer is disposed after the semiconductor layer sequence or semiconductor function region after the creation of the opening or side face.

Furthermore, the stabilization layer is preferably transparent to a radiation to be generated or received by the active zone. In this way the stabilization layer can also be part of a subsequent envelope or encapsulation of the optoelectronic component without disadvantageously reducing the efficiency of the component due to absorption of the incident or emitted radiation in the material of the stabilization layer.

The stabilization layer can be disposed after the semiconductor layer sequence or semiconductor function regions by various methods. For example, the stabilization layer can be provided by a vapor deposition process, such as for example a CVD or PVD process, or by spin coating. Materials that are particularly suitable for spin coating are, for example, BCB (BenzoCycloButene), a siloxane, a silicone, a spin-on oxide such as an aluminum oxide, for instance $Al_2O_3$, or a resist; for vapor deposition, for example by the CVD method, a glass is particularly suitable.

After being applied to the semiconductor function regions or semiconductor layer sequence, the stabilization layer is optionally cured, preferably at temperatures for example below 400° C. or below 300° C., which are substantially undamaging to the semiconductor structure, especially if the cure time is relatively short. This is particularly expedient if the material of the stabilization layer is applied from the liquid phase.

The stabilization layer can further be bonded to the semiconductor layer sequence or semiconductor function regions, for example via a wafer bonding process or anodic bonding or direct bonding. In particular, the stabilization layer can be attached to the semiconductor layer sequence or semiconductor function regions by means of van der Waals forces. For this purpose the stabilization layer can be blown onto the wafer composite. The stabilization layer can in this case be implemented particularly as planar and can for example include a glass plate.

The stabilization layer can further be disposed after the semiconductor layer sequence or semiconductor function regions with the aid of an adhesion promoting layer, said adhesion promoting layer preferably being disposed between the semiconductor function regions and the stabilization layer and/or preferably binding the semiconductor layer sequence or semiconductor function regions mechanically stably to the stabilization layer. The stabilization layer can in this case be implemented particularly as planar and can for example include a glass plate.

Furthermore, the stabilization layer can be configured as a window layer for radiation outcoupling.

The adhesion promoting layer can form around the semiconductor function regions and be part of a subsequent envelope and/or encapsulation of the optoelectronic component.

The adhesion promoting material can for example be a silicone, such as a siloxane, or a BCB. Apart from their good adhesion promoting action, these materials may also be distinguished by high stability against short-wave, for example ultraviolet, radiation, high temperature resistance and/or or high transparency to radiation. The adhesion promoting layer can optionally be partially or completely cured, for example thermally.

The stabilization layer can further be fashioned as a stabilizing film, which can be applied to, particularly laminated onto, the wafer composite, particularly the semiconductor layer sequence or semiconductor function regions. After being applied, the stabilizing film can optionally be cured, particularly photocured or thermally cured. After curing, the stabilizing film preferably forms a mechanically stable, preferably self-supporting, layer. This cured layer and/or the film are preferably radiation-transparent.

In a preferred embodiment of the invention, the semiconductor layer sequence is or the semiconductor function regions are mechanically stabilized via the stabilization layer such that the carrier layer can be structured, preferably from its side facing away from the stabilization layer. This structuring can be performed for example via a masking process in combination with an etching process or by mechanical methods such as grinding or sawing.

This structuring preferably results in the creation, from the carrier layer, of carrier layer regions which in the subsequent optoelectronic components form the carriers for the semiconductor function regions. To this end, the carrier layer is particularly preferably structured according to the arrangement of the semiconductor function regions on the carrier layer, at least one semiconductor function region preferably being disposed on substantially each carrier layer region. The mechanical stability of the composite composed of the stabilization layer, the semiconductor function region and the structured carrier layer regions is advantageously ensured by the stabilization layer. Assuming sufficient mechanical stability on the part of the, particularly self-supporting, stabilization layer, the carrier layer can optionally be removed completely, as stated hereinabove.

In the above-described method, for example components can be produced in which the edge length of the semiconductor function regions is from 10 µm to 100 µm, to 1000 µm or to 10 mm. An edge length of about 1000 µm has proven especially suitable. Below that magnitude, the edge length or dimensioning of the semiconductor function regions in the lateral direction is theoretically limited only by the resolution of the structuring methods used in the production process, particularly those used to structure the semiconductor layer sequence into semiconductor function regions or to structure the opening.

Methods that can be used for this purpose are, for example, a lithographic, particularly a photolithographic, method, employing a suitably configured mask in combination with a wet or dry etching process; a laser structuring method; or a mechanical structuring method, such as sawing.

Particularly advantageously, the entire method can be performed on-wafer, thus eliminating the need for cost-intensive individual preparatory steps. The method particularly makes it possible to produce complete, ready-to-use components inexpensively on-wafer. An optoelectronic component so produced can be positioned on a printed circuit board for example via a "pick and place" process, particularly immediately after singulation, and then electrically connected. The component can optionally be disposed in an additional housing, thereby further increasing the protection of the component.

In a further advantageous embodiment of the method, the optoelectronic component comprises an encapsulation that substantially hermetically tightly surrounds the semiconductor function region, particularly the active zone. The encapsulation preferably includes the envelope of the semiconductor function regions and at least one additional encapsulating element. The encapsulating element can advantageously be provided on-wafer and envelops or forms around the semiconductor function regions preferably from the side located oppositely from the envelope and/or the stabilization layer. This advantageously eliminates the need for an additional housing, to simplifying effect, while still providing adequate protection. It therefore becomes easier to create small components without an additional housing. The encapsulating element, particularly an encapsulating layer, can be applied on-wafer, for example by spin coating, and optionally partially or completely cured, for example thermally. The encapsulating element contains for example a BCB.

The envelope of the component can for example be derived from the stabilization layer during the singulation of the composite into components and/or can include part of the adhesion promoting layer, either of which can at least partially form around or envelop the semiconductor function regions.

In the above described method, the composite can in particular be singulated into optoelectronic components through the stabilization layer, particularly the envelope and/or the window, the isolation material and/or the adhesion promoting layer.

In a preferred embodiment of the method, prior to singulation, parting lines are formed that extend on into the layer that mechanically stabilizes the wafer composite. The parting lines can extend from the side of the composite facing away from the stabilizing layer and on into the stabilizing layer. Particularly preferably, the parting lines do not cut all the way through the stabilizing layer. The stability of the composite is advantageously preserved in this way despite the parting lines in the stabilizing layer. The parting lines are preferably configured such that the composite falls apart into single elements should the parting lines cut all the way through the stabilizing layer.

As described above, the stabilizing layer can for example be implemented as a stabilization layer or be constituted by the carrier layer.

If the stabilizing layer is thinned down at least to or into the parting lines, particularly from the side located oppositely from the semiconductor function regions and/or in the vertical direction, then the wafer composite "falls apart" into optoelectronic components or devices, since the thinning down to the parting lines causes the stabilization layer to lose its mechanically stabilizing effect. Such an alternative type of singulation is also known as "dicing by thinning."

The parting lines are further preferably disposed between two, particularly arbitrary, semiconductor function regions. Particularly preferably, a parting line extends, particularly in the lateral direction, all the way around a semiconductor function region assigned to it.

In a further preferred embodiment, disposed after the semiconductor function regions or semiconductor layer sequence, particularly on-wafer, is a phosphor or an absorbing material. The phosphor or absorbing material is preferably applied to the semiconductor layer sequence or semiconductor function regions, particularly directly, by means of electrostatic forces. A phosphor layer or absorbing material layer is preferably formed in this way.

The material—the absorber or phosphor—that is to be applied to the semiconductor layer sequence or semiconductor function regions is preferably applied thereto by electrostatic attraction, particularly electrostatic forces. To this end, applied to the side comprising the semiconductor function region is for example an auxiliary layer that is then electrostatically charged and is preferably electrically isolating. The material can for example be given a charge of the opposite sign from that used to charge the auxiliary layer, thereby producing an electrostatic attraction between the auxiliary layer and the material. If the material is electrically polarizable, then, advantageously, it need not be electrically charged. The auxiliary layer is preferably implemented as electrically isolating. For example, the auxiliary layer can be created by means of the isolation material.

Furthermore, the material is preferably applied to the side of the carrier layer or the stabilization layer facing away from the wafer composite. The material can be applied to the composite suitably structured, or it can be suitably structured after application.

Furthermore, the material to be applied can be applied in a material mixture that preferably contains, in addition to the absorbing material or phosphor, an adhesive material that enhances the adhesion of the material to the semiconductor function region or auxiliary layer. The adhesive material can optionally be partially or completely cured under elevated temperature. Particularly suitable for use as the adhesive material is a resin, for example a dry matrix polymer resin (thermoplast). The mechanical binding of the material to the semiconductor layer sequence or semiconductor function regions is improved by the adhesive material.

The charge can in particular be used to adjust the thickness of the material layer. During the application of the material by means of electrostatic forces, the thickness of the material layer to be applied can be adjusted by suitably selecting the charge. Furthermore, such a method makes it easier to apply a material layer in an even thickness. The thickness of the material layer is preferably between 15 and 25 µm.

In a further preferred embodiment, the phosphor or the absorbing material is disposed in the stabilization layer. For example, the phosphor or absorbing material can be disposed in a, preferably planar, stabilization layer, particularly a window layer. A filter glass plate or a glass plate containing, doped with or treated with a phosphor, particularly a material containing one of the rare earths, can be used as the stabilization layer.

The components or devices described above and in greater detail below are preferably produced according to the described method; consequently, the features cited in the method here and hereinafter can also relate to a component or a device and vice versa.

Further advantages, features and usefulnesses of the invention will emerge from the description of the following exemplary embodiments taken in conjunction with the figures.

BRIEF DESCRIPTION OF THE DRAWINGS

FIG. 5 shows an exemplary embodiment of an inventive device comprising a plurality of optoelectronic components, FIG. 7 is a schematic sectional view of a variant of the exemplary embodiment according to FIG. 1.

Like and like-acting elements are provided with like references in the figures.

DETAILED DESCRIPTION OF THE PREFERRED EMBODIMENTS

Figure 1:
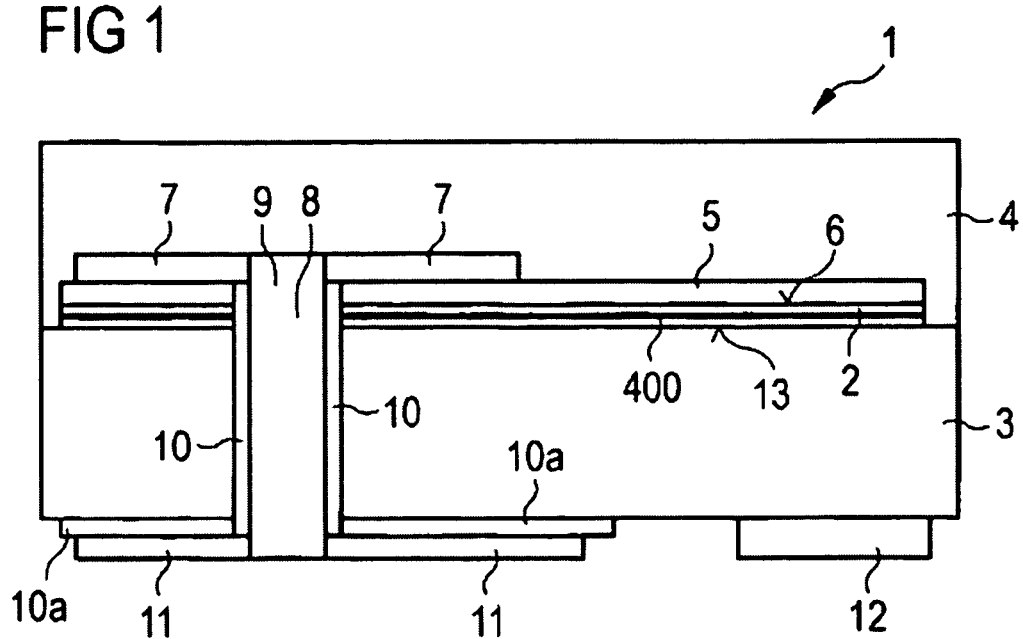
FIG. 1 shows a first exemplary embodiment of an inventive optoelectronic component in a schematic sectional view.

FIG. 1 depicts a first exemplary embodiment of an inventive optoelectronic component in a schematic sectional view.

The optoelectronic component 1 comprises a semiconductor function region 2 disposed on a carrier 3. The semiconductor function region comprises an active zone 400 provided to generate or receive radiation and has a lateral main direction of extension.

The active zone can for example comprise a heterostructure, particularly a double heterostructure, a single or multiple quantum well structure or a pn junction.

The semiconductor function region 2, particularly its active zone 400, comprises for example a plurality of semiconductor layers and/or is based for example on GaN or GaP. If the semiconductor function region is based on GaP, then the optoelectronic component is preferably intended for radiation in the infrared to yellow-green region of the spectrum, and in the case of a GaN-based semiconductor function region it is preferably intended for radiation in the ultraviolet to green region of the spectrum. GaP- or GaN-based III-V semiconductor materials are particularly well suited for the above regions of the spectrum due to the high internal quantum efficiency that can be attained. For example, InGaN or InGaAlP is particularly suitable for optoelectronic components.

The carrier 3 preferably contains a material suitable for use as a growth substrate for epitaxially producing the semiconductor function region, or the carrier is preferably composed of a suitable growth substrate for producing the semiconductor function region. GaAs or Ge, for example, is particularly suitable for use as a growth substrate of a GaP-based semiconductor function region, and SiC or sapphire, for example, as a growth substrate for a GaN-based semiconductor function region.

The active zone 400 is provided with an opening configured as a gap 9 that penetrates all the way through the semiconductor function region. Disposed in the region of the opening is a connecting conductor material 8. The gap is preferably completely surrounded in the lateral direction by the semiconductor function region and is consequently bounded laterally thereby.

The semiconductor function region is surrounded by an envelope 4 that is preferably implemented as radiation-transparent and contains for example a silicone, a BCB, a glass, a spin-on oxide, such as $Al_2O_3$, or a resist.

Disposed on semiconductor function region 2, preferably on the side thereof facing away from the carrier 3, is a current spreading layer 5. The current spreading layer advantageously has good electrical contact properties to the semiconductor material located on the side comprising, particularly located abuttingly to, the semiconductor function region.

The current spreading layer furthermore preferably has a high conductivity in the lateral direction, to facilitate uniform current inflow from the first main face 6 of the semiconductor function region into the semiconductor function region, particularly the active zone. This is of particular advantage for radiation-emitting components.

The current spreading layer further is preferably distinguished by high transparency to a radiation to be generated in or received by the semiconductor function region 2. This advantageously reduces the absorption of radiation in the current spreading layer while simultaneously affording good electrical contact properties.

In a preferred embodiment of the invention, the current spreading layer contains a radiation-transparent conductive oxide, particularly a metal oxide, for example a so-called TCO (Transparent Conducting Oxide). TCO materials, for example a zinc oxide, such as ZnO, a tin oxide, such as SnO, an indium tin oxide, such as ITO, a titanium oxide, such as TiO, or similar materials are well suited as materials for the current spreading layer owing to their relatively high conductivity in the lateral direction and high radiation-transparency over a broad range of wavelengths. ZnO, for example, is particularly suitable for contact to p-type semiconductor materials, particularly III-V semiconductor materials, and can create substantially ohmic contact thereto. To increase the conductivity in the lateral direction, the current spreading layer can for example be doped with a metal, such as Al in the case of ZnO. Particularly suitable for contact to n-type semiconductor materials is for example SnO, optionally doped with Sb. Unlike semiconductor materials, which can be integrated monolithically into the semiconductor function region, such a current spreading layer has an advantageously high conductivity in the lateral direction. It therefore becomes unnecessary to provide a comparatively thick semiconductor integrated into the semiconductor function region to effect current spreading. This facilitates the creation of planar components.

Disposed after, preferably immediately after, the current spreading layer 5 as viewed from the first main face 6 of the semiconductor function region is a first contact layer 7 which is electrically conductively connected to the current spreading layer. The first contact layer preferably contains a metal, for example Ti, Pt, Au, Al or an alloy comprising at least one of these materials.

Figure 4A:
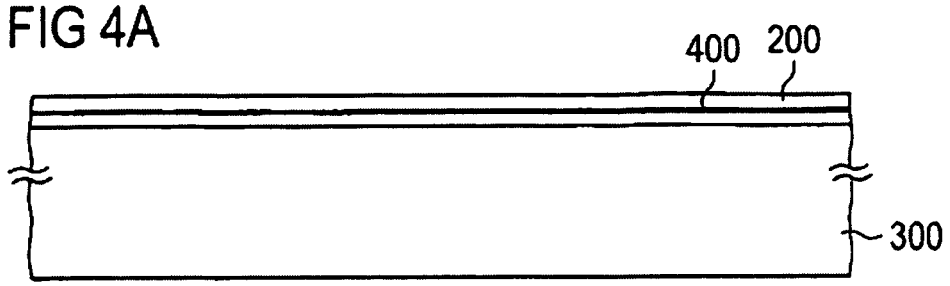
FIG. 4 shows a first exemplary embodiment of an inventive method for producing an optoelectronic component by means of intermediate steps depicted in various schematic views in FIGS. 4a to 4i.
Figure 4B:
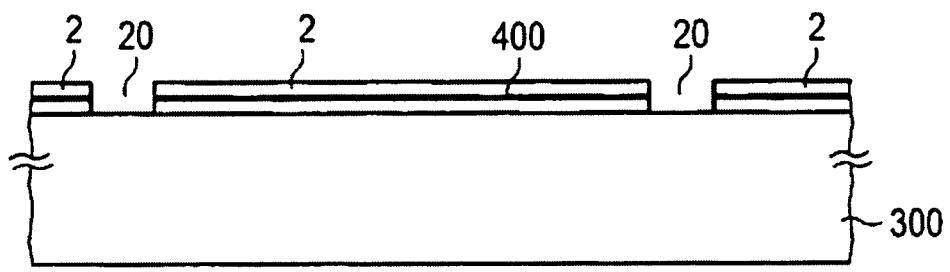
Figure 4C:
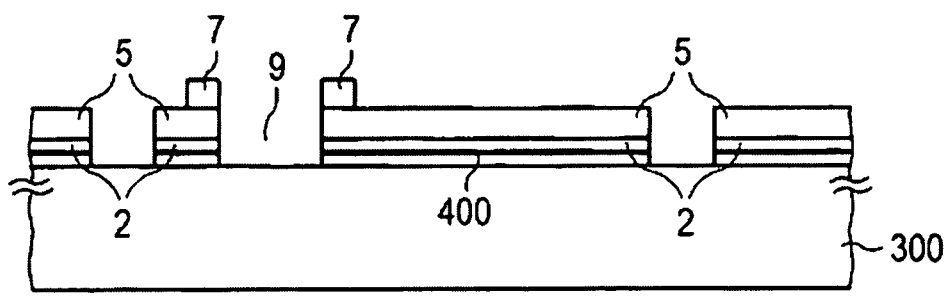
Figure 4D:
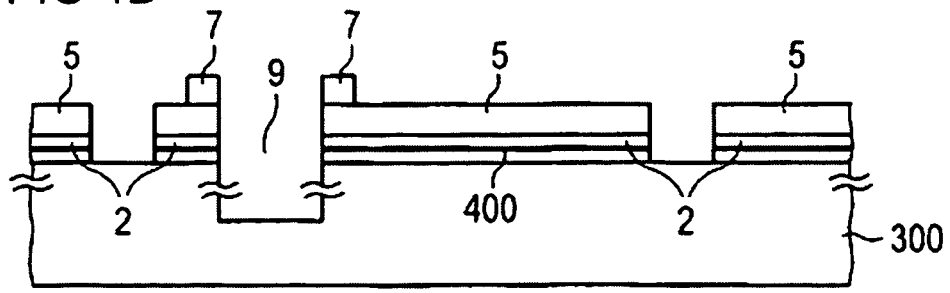
Figure 4E:
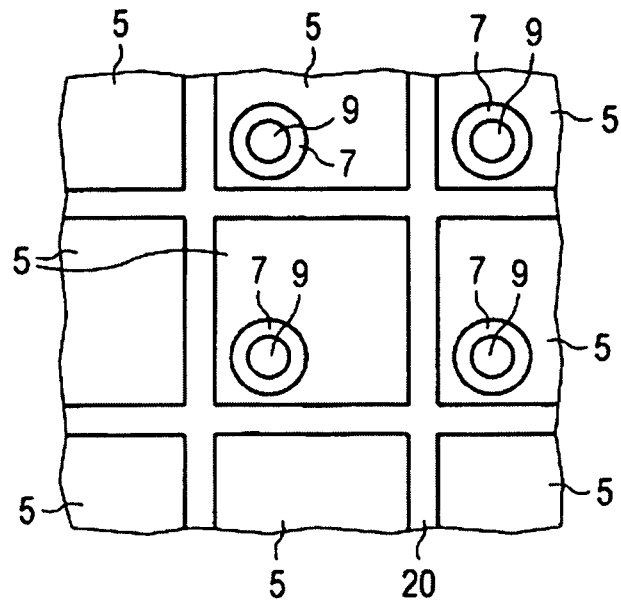

The first contact layer is preferably configured as substantially ring-shaped in plan (see the schematic plan view in FIG. 4e). In its central region, contact layer 7 is electrically conductively connected to a connecting conductor material 8, which for example also contains a metal, such as Sn. Sn is particularly advantageous for the production of such an optoelectronic component, particularly for producing the connecting conductor formed by the connecting conductor material 8 (see the description of the exemplary embodiment provided in conjunction with FIG. 4).

Connecting conductor material 8 extends in the vertical direction through the opening in the active zone in semiconductor function region 2 from first contact layer 7 through the region of current spreading layer 5 and semiconductor function region 2 and through carrier 3 to the side of the carrier opposite from the semiconductor function region. Hence, according to the present exemplary embodiment the opening penetrates not only through the semiconductor function region, but also all the way through the carrier 3. In the region of the carrier the opening is preferably configured as a gap, which particularly preferably is bounded entirely by the carrier in the lateral direction.

Semiconductor function region 2 and, particularly, active zone 400 are electrically isolated from electrically conductive connecting conductor material 8 in the region of the opening by an isolation material 10, for example containing SiN. This prevents active zone 400 from disadvantageously short circuiting through connecting conductor material 8, causing the component to malfunction when in operation. The gap 9 is filled substantially completely with the connecting conductor material and is electrically isolated from the semiconductor function region at least in the region thereof. Isolation material 10 preferably completely covers the wall of the gap in the semiconductor function region, particularly at the active zone.

Connecting conductor material 8 is connected electrically conductively by a first interconnect 11 to the side of the carrier facing away from semiconductor function region 2. Disposed between the first interconnect and the carrier is an additional isolation material 10a, for example containing SiN. This additional isolation material isolates the first interconnect electrically from a second interconnect 12 disposed on the side of the carrier facing away from the semiconductor function region. Additional isolation material 10a preferably has a greater extent in the lateral direction than the first interconnect, to further reduce the risk of short circuiting of interconnects 11 and 12.

Interconnect 12 is conductively connected to the carrier, which is preferably implemented as electrically conductive, so that the semiconductor function region can be driven electrically via the first interconnect and the second interconnect. For example, the first and/or the second interconnect contain a metal, such as Ti, Pt, Al or Au. Alloys, particularly alloys comprising at least one of these metals, such as AuGe, are also suitable for creating the interconnects.

The contacting of the component is effected through the semiconductor function region and particularly the region of the active zone, for which reason the isolation material 10 is preferably thick enough to prevent the active zone from short circuiting across the connecting conductor material. The gap is preferably lined over its full area with the isolation material.

Envelope 4 forms in combination with carrier 3 a protective encapsulation for the active zone or the semiconductor function region.

The optoelectronic component 1 depicted here can be produced entirely on-wafer (see the schematic diagram of the production of similar components according to the exemplary embodiment described in FIG. 4).

The semiconductor function region is produced for example epitaxially on a growth substrate from which the carrier 3 can be derived, and after being grown can be provided with the current spreading layer 5. This can be followed by the creation of the conductor structure comprising the opening configured as gap 9 and the forming of the isolation material, the connecting conductor material and the first contact layer. Thereafter an envelope material is applied, preferably in the liquid phase, to the semiconductor function region and the carrier on the side comprising the first main face of the semiconductor function region. This envelope material can for example be vapor deposited or applied by spin coating. Working from the second main face 13 of the semiconductor function region, the isolation material 10a, the first interconnect 11 and the second interconnect 12 are provided for example by vapor deposition or sputtering.

Such a component can be produced in various sizes. These various sizes can also correspond to various dimensioning schemes for the contact structure of the component and particularly of the opening or gap 9. The lateral extent of the semiconductor function region can for example range from 10 μm to a few 100 μm, for example 200 μm, 300 μm or 400 μm. The lateral dimension, e.g. the diameter, of the opening or gap is then, commensurately, 100 or a few 100 nm to roughly 30 μm or 50 μm. By suitably adapting the lateral dimension of the connecting conductor material and the number of gaps—otherwise than as shown, a plurality of gaps can also be provided—the conductivity or current carrying capacity necessary for efficient contacting of the semiconductor function region can be obtained. The contacting of the semiconductor function region or the component can be effected via interconnects 11 and 12, both of which are disposed on the second main face side of the semiconductor function region. The optoelectronic component is therefore configured in particular as surface-mountable. For example, interconnects 12 and 13 can be soldered to tracks on a printed circuit board.

This advantageously eliminates the need for an electrical contact that requires the use of a bonding wire or similarly complex measures for contacting the semiconductor function region. The creation of very small components is therefore simplified.

Furthermore, the carrier can be eliminated at least in part, since the envelope preferably has a mechanically stabilizing effect on the semiconductor function region. Consequently, during the production of the component the carrier layer can be at least partially or completely removed from the semiconductor function region or thinned down, for example by grinding or etching. This advantageously reduces component height.

The semiconductor function region of such a component can accordingly be formed of a, particularly epitaxially, growable layer structure. There is no need for a carrier to stabilize the semiconductor function region. In the extreme case, the semiconductor function region comprises substantially only the active zone 400.

The envelope can further be made to contain a phosphor, for example in the form of phosphor particles, which partially absorbs the radiation generated by the semiconductor function region and reemits it as longer-wavelength radiation. The two radiations can subsequently intermix to yield mixed-color light, particularly white light. If the component is intended to emit white light, then the semiconductor function region is preferably based on GaN, which is particularly suitable for generating short-wave, particularly blue or ultraviolet, radiation. The phosphor is preferably implemented as a YAG-based phosphor and converts for example blue radiation partially into yellow radiation. White light is obtained by suitably mixing blue and yellow radiation fractions.

The phosphor can optionally be disposed on the semiconductor function region as a phosphor layer, which can be placed between the envelope and the semiconductor function region. In this case the phosphor is preferably applied to the semiconductor function region by means of electrostatic forces.

Figure 2:
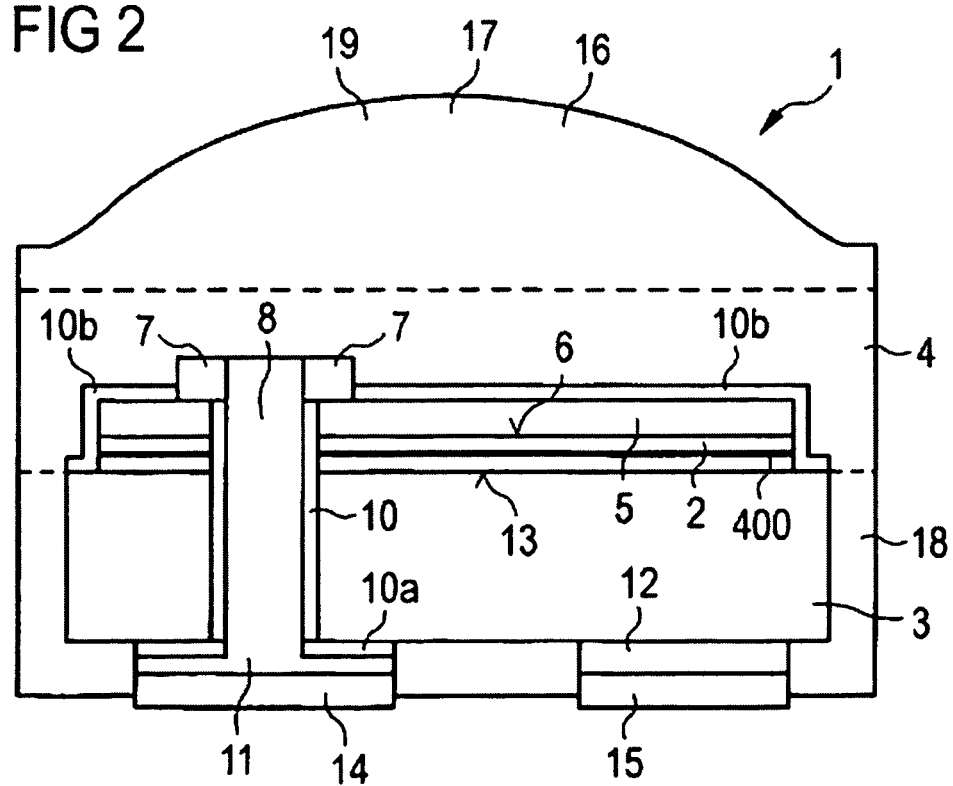
FIG. 2 shows a second exemplary embodiment of an inventive optoelectronic component in a schematic sectional view.

FIG. 2 shows a second exemplary embodiment of an inventive optoelectronic component in a schematic sectional view.

The component shown here is substantially the same as that depicted in FIG. 1.

In contrast to the component illustrated in FIG. 1, in FIG. 2 an additional isolation material 10b is disposed after the current spreading layer 5. This isolation material layer can for example contain SiN and has not only an isolating effect, but also, preferably, a protective or passivating effect on semiconductor function region 2 and particularly on its active zone. Isolation material 10b is preferably also disposed on the flanks of semiconductor function region 2 and particularly preferably extends in the vertical direction from the first main face 6 to the second main face 13 of the semiconductor function region. This additional isolation layer or passivating layer further increases the protection of the active zone against harmful external influences. As in the case of the component shown in FIG. 1, the electrical contacting of the component is effected through the first contact material 7 on the side comprising the first main face 6 of semiconductor function region 2, which is connected electrically conductively to connecting material 8.

The passivating layer additionally protects the lateral flanks of the semiconductor function region and is preferably disposed thereon. Passivating layer 10b can additionally be disposed on carrier 3.

One or more antireflection layers, which can be implemented for example as $\lambda/4$ layers, can be disposed between the envelope 4 and the semiconductor function region, particularly between the passivating layer and the envelope. The passivating layer can in particular be fashioned as an antireflection layer. Reflection losses caused by jumps in refractive index at interfaces can advantageously be reduced in this way.

Connecting conductor material 8 is electrically conductively connected to first interconnect 11, which is electrically isolated by isolating material 10a from second interconnect 12 on the side comprising the main face of the carrier, located oppositely from the semiconductor function region. A first 14 and a second 15 solder layer are disposed on the sides of, respectively, interconnects 11 and 12 that face away from the carrier. These solder layers contain for example AuGe and are preferably electrically conductively connected to the respective interconnects. Solder layers of this kind facilitate the connection, e.g. via soldering, of interconnects 11 and 12 to external interconnects, for example the tracks of a printed circuit board or similar external conducting devices.

In further contrast to the exemplary embodiment of FIG. 1, the optoelectronic component depicted in FIG. 2 is provided with an encapsulation 16. This encapsulation includes a window 17, which, viewed from the first main face of the semiconductor function region, is disposed after envelope 4, which at least partially envelops or is embedded in the semiconductor function region. Furthermore, encapsulation 16 includes an encapsulating element 18 that is disposed after envelope 4 in the direction of the carrier or is arranged on the side of the semiconductor function region opposite from the first main face. Encapsulating element 18 preferably embraces carrier 3, for example in a pincer-like manner, from the side thereof facing away from semiconductor function region 2. Encapsulating element 18 can in particular abut envelope 4 in the region of the second main face 13 of semiconductor function region 2. Encapsulation 16, which can include envelope 4 and encapsulating element 18 and optionally window 17, can advantageously be created on-wafer.

The broken lines in FIG. 2 in the region of envelope 4 and encapsulating element 18 denote the boundary areas between the various elements of the encapsulation. Advantageously, envelope 4 and encapsulating element 18 can themselves constitute an encapsulation that is substantially hermetically tight against external influences. The material of the encapsulating element can advantageously be selected arbitrarily within the framework of production capabilities and can in particular be implemented as substantially impermeable to radiation, since very little of the radiation to be received or generated by the semiconductor function region strikes the encapsulation in the region of encapsulating element 18. Window 17 and envelope 4 are preferably configured as radiation-transparent with respect to this radiation in order to advantageously increase the efficiency of the component.

Window 17 can comprise for example a glass, a portion of a glass plate or substantially the same material as the envelope. In the latter case, envelope 4 and window 17 can advantageously be formed in one method step. In particular, the envelope and the window can be configured in one piece in a common structure. In that case the broken line between the window and the envelope is an imaginary line. If the window and the envelope are configured in two pieces, however, then the broken line denotes the boundary area between those elements.

In this exemplary embodiment, an optical element 19 is formed in window 17. This optical element can advantageously be fabricated right in the wafer composite. The window material is structured suitably to achieve this. In the case of a one-piece configuration for the envelope and the window, the envelope can in particular be shaped to correspond to the configuration of the optical element. The structuring of the window can be effected for example by means of etching processes or by punching the structure of the optical element into the window material, which can optionally still be plastically formable after being applied. In this exemplary embodiment, the optical element is configured as convex in the manner of a lens and advantageously increases the efficiency of the optoelectronic component. Furthermore, for purposes of uniform radiation distribution it is possible to provide a scattering element, which can be implemented for example by means of a scattering structure, e.g. structured from the window, or scattering particles, e.g. disposed in the window and/or the envelope. The optical element can optionally also be fashioned as a Fresnel lens.

In connecting the solder layers 14 and 15 to external leads, the solder is usually subjected to high temperatures during the soldering process, causing it to at least partially soften. Advantageously, during the soldering process the solder bonds to the material of the encapsulating element in the areas adjacent to the encapsulating element in such fashion that the encapsulation of the optoelectronic component is sealed to a greater extent.

The elements of the encapsulation, particularly encapsulating element 18 and envelope 4, are preferably so constituted as to be substantially resistant to, preferably dimensionally stable against, the temperatures that occur during soldering for at least a period of time equal to that of the soldering process.

Window 17 can be created in tandem with envelope 4 or for example glued to the envelope. In the latter case the envelope itself preferably has an adhesive action, thus eliminating the need for an additional adhesive layer between the window and the envelope. Due to the smaller number of interfaces, this can have advantages for radiation outcoupling or incoupling or in the semiconductor function region.

If window 17 is disposed on envelope 4 by adhesive bonding, then the envelope preferably contains silicone or BCB, which can have an adhesion promoting effect on the envelope and the window material. This applies in particular to windows that contain glass or are made from a glass plate.

A phosphor, particularly for generating mixed color light, is preferably disposed in the envelope 4 as close as possible to the active zone. In particular, the envelope material can serve as a carrier matrix for phosphor particles, which can subsequently be applied to the semiconductor function region along with the material of the envelope. The risk of degradation of the envelope or window due to high-energy short-wave radiation is reduced by wavelength conversion near the semiconductor function region.

Differently from the representation of FIGS. 1 and 2, a mirror layer can be disposed on the side of the semiconductor function region facing the carrier, for example a Bragg mirror, particularly one that is monolithically integrated into the semiconductor function region, or a metal-containing, particularly metallic, mirror layer, for example containing Au, Pt, Al or an alloy comprising at least one of these metals, such as for example AuGe. In the case of a metallic mirror layer, the carrier 3 is preferably different from the growth substrate of the semiconductor layer sequence, from which the semiconductor function region is preferably formed on-wafer. Once the mirror layer has been applied to the side of the semiconductor function region or semiconductor layer sequence facing away from the growth substrate, the growth substrate is removed. Prior to the removal of the growth substrate, the semiconductor function region or semiconductor layer sequence is attached or disposed, particularly on the side comprising the mirror layer, on a carrier layer from which the carrier 3 of the thin film component is derived on singulation. Said carrier 3 is in particular different from the growth substrate.

A corresponding variant of the exemplary embodiment according to FIG. 1 is illustrated schematically in FIG. 7 in a sectional view. The metal-containing mirror layer 22, containing for example Au or Ag, is disposed between carrier 3, which is different from the growth substrate, and semiconductor function region 2. Preferably disposed between the mirror layer and carrier 3 is a binding layer 25, for example a solder layer, by means of which the semiconductor function region is mechanically stably attached to the carrier. The opening configured as a gap 9 penetrates in particular through semiconductor function region 2, mirror layer 22 and binding layer 25.

Differently from the representation of FIG. 2, the carrier 3 can, moreover, be eliminated. Particularly if the envelope and/or the window layer, preferably completely, mechanically stabilizes semiconductor function region 2, the carrier can be thinned down or, particularly completely, removed without substantially increasing the risk of damaging the semiconductor function region. This simplifies the creation of thin optoelectronic components. If the carrier of the semiconductor function region is omitted, then the encapsulating element 18 can extend substantially planarly on the side of the semiconductor function region comprising second main face 13 or the encapsulating element can be fashioned as a planar layer.

Figure 8:
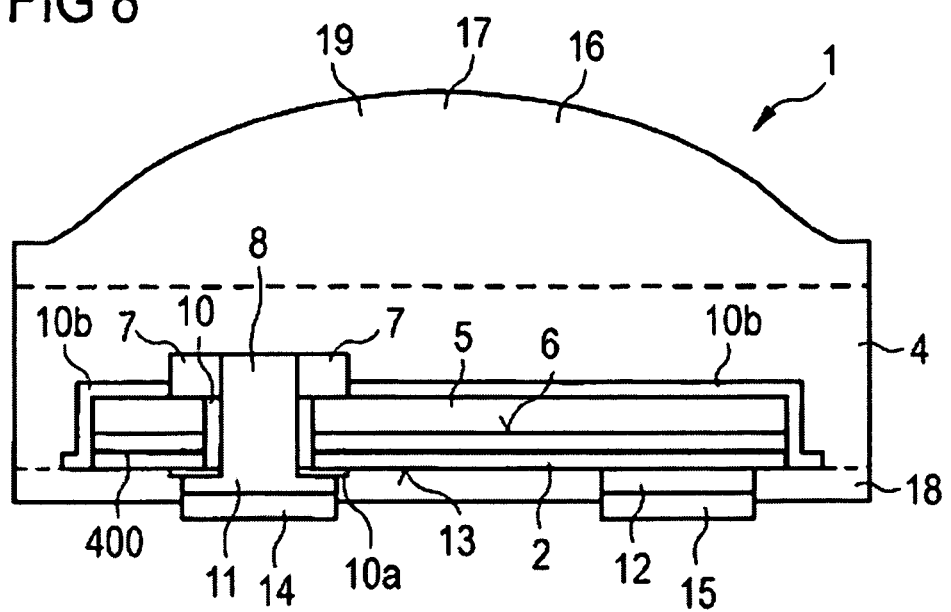
FIG. 8 is a schematic sectional view of a variant of the exemplary embodiment according to FIG. 2

A corresponding variant of the exemplary embodiment according to FIG. 2 is schematically illustrated in FIG. 8 in a sectional view. In contrast to the exemplary embodiment shown in FIG. 2, in the exemplary embodiment of FIG. 8 component 1 does not include a carrier for semiconductor function region 2. The semiconductor function region can be configured here as a monolithically integrated, for example epitaxially growable, semiconductor layer structure. In particular, all the semiconductive parts of the component can be monolithically integrated. Encapsulating element 18 directly abuts the second main face of semiconductor function region 2. Encapsulating element 18 furthermore abuts envelope 4. Optoelectronic components such as those illustrated in FIG. 2 or the variants depicted in FIGS. 7 and 8 can be produced entirely on-wafer, inclusive of encapsulation.

Figure 3:
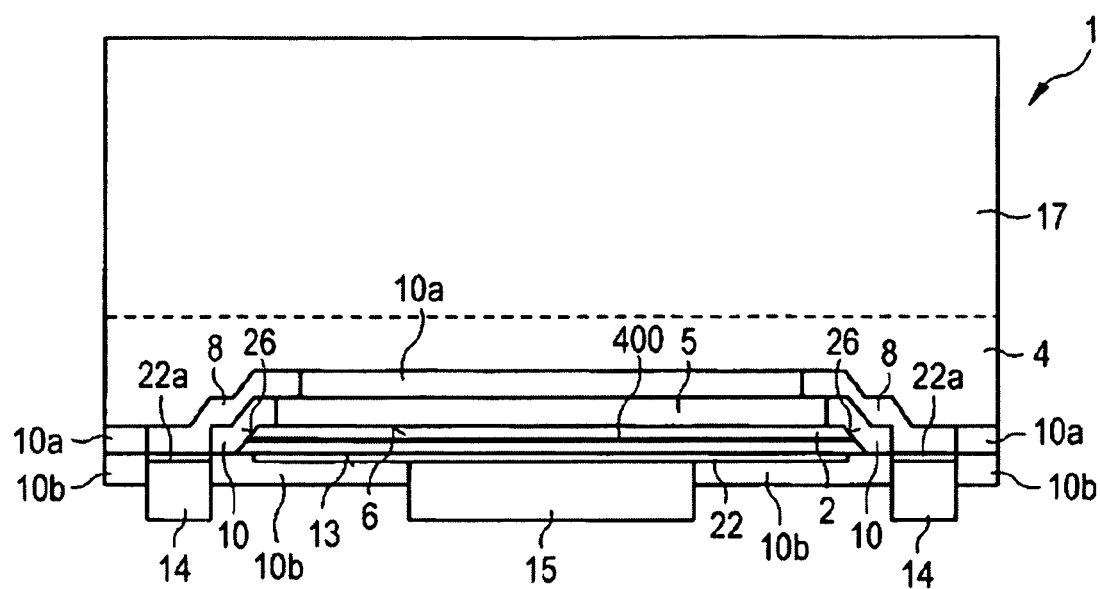
FIG. 3 shows a third exemplary embodiment of an inventive optoelectronic component in a schematic sectional view.

FIG. 3 shows a further exemplary embodiment of an inventive optoelectronic component in a schematic sectional view.

In this exemplary embodiment, the optoelectronic component 1 is fashioned as a so-called thin film component. As mentioned above, "thin film component" here means that the growth substrate of a semiconductor layer sequence from which the semiconductor function region 2 is created is removed during the production process. The growth substrate can be removed for example via a laser ablation or laser cutting process, etching, or mechanical methods. Before or after the removal of the growth substrate, the semiconductor layer sequence or the semiconductor function region is preferably provided with a, particularly preferably metal-containing, mirror layer. The mirror layer can improve the efficiency of the optoelectronic component. For example, the mirror layer can reduce the absorption of radiation generated in the semiconductor function region by a structure, such as for example a printed circuit board, disposed on the side of the mirror layer located oppositely from the semiconductor function region.

FIG. 3 shows a thin film component that can be produced entirely on-wafer.

The optoelectronic component 1 comprises a semiconductor function region 2 with an active zone 400 and a lateral main direction of extension, said semiconductor function region having a lateral side face 26 bounding the active zone and there being disposed after the side face in the lateral direction a connecting conductor material 8 that is electrically isolated from the active zone 400 in at least a subregion of the side face 26. Side face 26 can in particular be fashioned as planar, that is, free of any depression in the lateral direction.

Connecting conductor material 8 is isolated from the semiconductor function region in the lateral direction in the region of the side face by isolation material 10, which preferably directly abuts side face 26. To this end, the connecting conductor material is in particular spaced apart from the side face in the lateral direction by the isolation material. On the whole, this at least greatly reduces the risk of the active zone short circuiting through the connecting conductor material.

Side face 26 preferably borders the semiconductor function region over its entire vertical extent. Semiconductor function region 2 or active zone 400 can further be bounded on all sides by side faces configured in this manner. In particular, semiconductor function region 2 or active zone 400 can be bounded in the lateral direction by a plurality of side faces.

Disposed after semiconductor function region 2, which is for example based on GaN or GaP, on the side comprising its first main face 6, is a current spreading layer 5. Current spreading layer 5 can for example comprise a TCO material, such as ZnO, or a suitable III-V semiconductor material. TCO material are preferred, however, since III-v semiconductor materials, particularly those that can be produced epitaxially along with the semiconductor function region, usually have a relatively low conductivity in the lateral direction.

Semiconductor function region 2 is electrically conductively connected on the side comprising its first main face 6 to connecting conductor material 8 via current spreading layer 5. To this end, the connecting conductor material extends in the vertical direction from the first main face to the second main face 13 of the semiconductor function region.

Disposed after the semiconductor function region on the side thereof comprising its second main face is a mirror layer 22. The mirror layer preferably contains a metal, for example Ti, Au, Pt, Ag, Al or an alloy comprising at least one of these metals, such as AuGe. Mirror layer 22 is preferably implemented as reflective of a radiation to be generated or received by the optoelectronic component and advantageously increases the efficiency of the component. The mirror layer can be disposed, particularly directly, on the semiconductor function region.

If the optoelectronic component is implemented for example as an emitter, then radiation is generated in the active zone of the semiconductor function region when the component is in operation. Radiation that is emitted by the active zone in the direction of the mirror is reflected by the mirror layer in the direction of the first main face 6 of the semiconductor function region 2 and can exit the component through current spreading layer 5, envelope 4 and, if applicable, a window 17 disposed after the envelope. Advantageously, mirror layer 22 considerably reduces the radiation fraction exiting the component in the direction of the second main face, thereby at least greatly reducing absorption in structures, such as for example a printed circuit board, that may be disposed after the mirror layer as viewed from the semiconductor function region.

On its side facing away from the semiconductor function region, mirror layer 22 is electrically conductively connected to a solder layer 15. Connecting conductor material 8 is conductively connected to an additional solder layer 14 on the side comprising the second main face 13 of semiconductor function region 2. Disposed in the interspace between additional solder layer 14 and solder layer 15 is an additional isolation material 10b, for example containing SiN, which reduces the risk of a short circuit of the electrical interconnects belonging to the optoelectronic component and formed by the solder layers. The semiconductor function region is electrically contactable externally via the connecting conductor material and the mirror layer and the interconnects or solder layers.

The optoelectronic component shown is provided with a substantially hermetic encapsulation of the semiconductor function region. The semiconductor function region is here surrounded on all sides by protective material, such as the isolation material, which preferably also serves as a passivating layer or protective layer, in the form of layers 10, 10a, 10b. Only in the region of the electrical contacts is this protective structure interrupted. When the interconnects are soldered, the solder layers preferably bind to the isolation material and thereby advantageously further increase the protection of the semiconductor function region. The isolation material can for example fuse to the solder layers for this purpose.

Furthermore, the semiconductor function region is at least partially surrounded by or embedded in the envelope 4, which further increases the protection of the semiconductor function region. This is particularly true of the side of the optoelectronic component which, after mounting on a printed circuit board, is located oppositely from the printed circuit board as viewed from the semiconductor function region and may therefore be more exposed to harmful external influences.

Envelope 4 is radiation-transparent to a radiation that is to be generated or received by the semiconductor function region and can contain for example a silicone or a BCB, silicone being distinguished by its particularly advantageous resistance to short-wave, particularly ultraviolet, radiation, or can comprise an envelope material different from the aforesaid materials and applied for example by vapor deposition or spin coating. The window 17 disposed after the envelope can for example be part of a glass plate that is joined to the envelope material by an adhesive bond, for example also by means of a silicone or a siloxane. Envelope 4 and window 17 can also, however, be made of substantially the same material and can in particular be configured in one piece, as indicated by the broken line (see analogous explanation concerning the exemplary embodiment of FIG. 2).

The layer 22a disposed between solder layer 14 and connecting conductor material 8 contains for example the same material as the mirror layer, which can be advantageous in fabricating the component on-wafer. In particular, a common mask structure can thus be used to apply the solder layers and the mirror layer. Particularly advantageously, the mirror layer and the solder layers can contain the same material, for example AuGe.

Differently from the representation of FIG. 3, the optoelectronic component can also include an additional encapsulating element, provided for example on the side comprising the second main face, for example analogously to encapsulating element 18 illustrated in FIG. 2. Such an encapsulating element can advantageously further increase the protection of the semiconductor function region against harmful external influences.

The stepped portion, illustrated in FIG. 3, between current spreading layer 5 and semiconductor function region 2 can simplify the application of isolation material 10, as can edgewise beveling of the semiconductor function region. The risk of breaks in the isolation material that might occur at abrupt edges, and thus the risk of short circuiting, can advantageously be reduced by suitably configured steps or bevels, for example in the structures to be coated with the isolation material 10 or additional materials, e.g. connecting conductor material 8.

Window 17 and/or envelope 4 preferably have a stabilizing effect on the semiconductor function region such that during the production of the component, a carrier layer disposed on-wafer on the side comprising the second main face—for example the growth substrate of the semiconductor function region—can be removed completely and the mirror layer 22 can then be applied to the second main face 13.

Schematically illustrated in FIG. 4, in various views and intermediate steps, is an exemplary embodiment of an inventive method for producing optoelectronic components. The production of a component similar to that depicted in FIG. 2 is illustrated.

First, a semiconductor layer sequence 200 having a lateral main direction of extension and comprising an active zone 400 provided to generate and/or receive radiation is prepared on a carrier layer 300, as illustrated in FIG. 4a. Carrier layer 300 is for example constituted by the growth substrate on which semiconductor layer sequence 200 was epitaxially grown. For example, the semiconductor layer sequence is based on at least one III-V semiconductor material system. The growth substrate can contain for example GaAs in the case of GaP- or GaAs-based semiconductor layer sequences, or SiC or sapphire in the case of GaN-based semiconductor layer sequences.

The wafer composite, or the semiconductor layer sequence of the wafer composite, so prepared is then structured so as to produce a plurality of semiconductor function regions 2, which are arranged on the common carrier layer 300 spaced apart from one another by interspaces 20 (FIG. 4b). The interspaces 20 form for example a substantially lattice-like pattern on the carrier layer as viewed from above. The structuring of the semiconductor layer sequence 200 in the semiconductor function regions 2 is performed for example via photolithographic structuring methods in combination with etching methods, laser structuring or other known structuring methods, such as sawing.

For example, a photoresist layer is first applied to the side of the semiconductor layer sequence facing away from the carrier layer, and is then exposed to light and developed using a mask structure that corresponds to the intended arrangement of the semiconductor function regions. In the regions where the photoresist has been removed from the semiconductor layer sequence by developing, the semiconductor layer sequence can be structured from the side opposite from the carrier layer by wet or dry chemical etching. Once the semiconductor layer sequence has been structured into a plurality of semiconductor function regions, the photoresist material can be removed.

FIG. 4b schematically illustrates in sectional view the semiconductor function regions 2 spaced apart from one another by interspaces 20 and disposed on the carrier layer 300. Differently from the representation of FIG. 4b, the interspaces 20 can also extend on into the carrier layer 300.

A current spreading layer 5, for example containing ZnO, $SnO_2$ or SnO, is then applied to the semiconductor function regions (FIG. 4c). To increase conductivity, ZnO can be doped with Al and $SnO_2$ or SnO can be doped with Sb. The current spreading layer 5 can be applied structured to the semiconductor function regions using a mask structure, for example a photoresist mask that is to be removed after the application of the current spreading layer.

Alternatively, the current spreading layer 5 can be applied, preferably with full coverage, to the side of semiconductor layer sequence 200 facing away from carrier layer 300 before the semiconductor layer sequence is structured into semiconductor function regions. Any necessary structuring of the semiconductor layer sequence and of the current spreading layer in this case can advantageously be performed in one method step, particularly using a common mask.

The current spreading layer is preferably applied to the semiconductor function regions or semiconductor layer sequence by vapor deposition, particularly sputtering.

The semiconductor function regions 2 are preferably almost completely covered with the current spreading layer. Differently from the representation of FIG. 4, at the edges of the semiconductor function regions stepped portions can be formed between the semiconductor function regions and the current spreading layer, thereby reducing the risk of damage, for example due to cracking, to elements that are to be disposed in the edge region of the semiconductor function region during subsequent phases of production. In addition, the semiconductor function regions or the current spreading layer can be provided for this purpose with a, particularly marginal, bevel.

After the application of the current spreading layer, the structure comprising the semiconductor function regions and a current spreading layer is structured such as to produce an opening, configured as a gap 9, through the active zone. Gap 9 extends through current spreading layer 5 and semiconductor function regions 2 to the carrier layer.

Optionally, the current spreading layer can be applied already prestructured to the semiconductor function regions or semiconductor layer sequence or can be suitably prestructured after being applied. In particular, a gap in the current spreading layer can have a larger lateral dimension than a gap made in the semiconductor function region through the region of the gapped current spreading layer.

The gap 9 in semiconductor function region 2 and/or in current spreading layer 5 can be created for example by a masking and subsequent etching process or another suitable structuring method.

Before or after the structuring of gap 9, a first contact layer 7, for example containing a metal such as Ti, Pt or Au, is applied to the side of current spreading layer 5 facing away from semiconductor function region 2. This application can be performed for example by sputtering or vapor deposition, particularly using a suitably configured mask. The first contact layer is preferably applied structured conformably with gap 9 or is structured conformably therewith after being applied. In the latter case, the structuring of the contact layer is preferably executed in one step with the creation of gap 9, particularly using a common mask.

To increase the size of the contact area between current spreading layer 5 and first contact layer 7, a stepped portion is preferably formed between the current spreading layer and the semiconductor function region in the region of the gap. The first contact layer can then extend, otherwise than as shown in FIG. 4c, along the stepped portion of the current spreading layer, from the side of the current spreading layer facing away from the semiconductor function region vertically down to the semiconductor function region. In particular, the wall of the gap in the current spreading layer can be covered with the material of the first contact layer. In this way, the contact area between the current spreading layer and the contact layer can be further enlarged without significantly increasing the sector of the active zone shaded by the contact layer. Absorption losses due to absorption of radiation in the first contact layer can thus be reduced in comparison to a contact layer of equal area disposed entirely on the side of the current spreading layer facing away from the semiconductor function region.

The resulting structure, comprising carrier layer 300, semiconductor function regions 2 disposed on the carrier layer, current spreading layers 5 disposed on the semiconductor function regions, and first contact layers 7, which for example extend ring-like around the gap, is depicted schematically in FIG. 4c in a sectional view.

Thereafter, in the semiconductor function region that forms the opening through the active zone 400, the gap 9 is sunk deeper vertically into the carrier layer, this again being performed for example via masking and etching processes. The resulting structure is illustrated schematically in FIG. 4d. Preferably, however, the gap is structured into the carrier layer concurrently with the creation of the gap in the semiconductor function region and the current spreading layer; hence, the gap 9 shown in FIG. 4c can already extend on into the carrier layer.

FIG. 4e is a plan view of the structure from FIG. 4d. The semiconductor function regions 3 covered by current spreading layer 5 are configured here as substantially square and are separated from one another by a continuous network of interspaces 20. The gaps 9 in the semiconductor function region are substantially circular in this exemplary embodiment and are arranged in the regions of the corners of the respective semiconductor function regions.

Disposed around the gaps 9 is the first contact layer 7, which preferably runs around the gap. Arranging the gaps in the corner regions of the semiconductor function regions advantageously increases the efficiency of a subsequent optoelectronic component, since the central area of the active zone in the middle of the semiconductor function region, which normally has a particularly high quantum efficiency in terms of radiation generation or reception, is advantageously substantially free of contact layer 7 and is therefore not covered by it. Absorption through a metallic contact layer in this central region of high efficiency is therefore largely prevented.

The lateral dimension, for example the diameter or an edge length, of gap 9 can range for example from 100 nm to about 100 μm. More than one gap can also be provided in a given semiconductor function region. The lateral dimension can be adapted to specific requirements within the framework of the production method, depending on the configuration and size of the subsequent optoelectronic component or semiconductor function region.

An isolation material 10, containing for example a silicon nitride, such as SiN, is applied to the structure illustrated in FIG. 4d. The isolation material can be applied for example with full coverage to the structure illustrated in FIG. 4d. A vapor deposition process, such as sputtering or PECVD, is particularly suitable for applying the isolation material.

The isolation material covers the wall of the gap at least in the region where said wall is constituted by the semiconductor function region. Application of the isolation material to the wall of the gap can be facilitated by providing the gap with a suitably beveled wall or walls.

The isolation material is then structured, for example via a photolithographic process in combination with an etching process, in such fashion that first contact layer 7 is free of isolation material 10 at least in a subregion. The structuring can optionally also be performed by backsputtering. Furthermore, the isolation material can also be applied already suitably structured, by means of a suitable mask, to the structure illustrated in FIG. 4d or 4e.

Figure 4F:
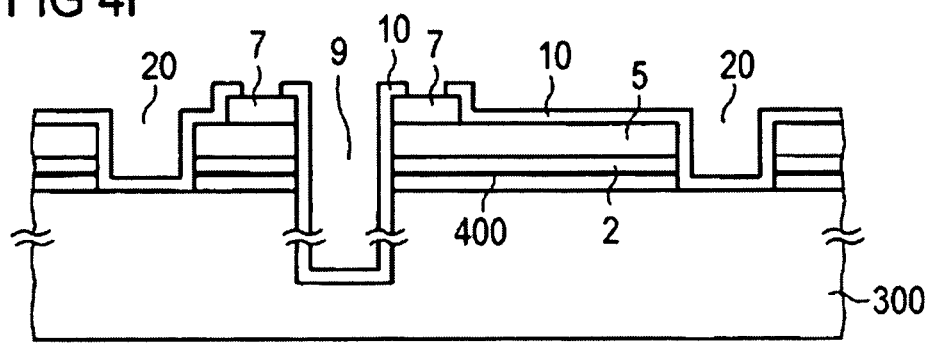

The resulting structure is depicted schematically in sectional view in FIG. 4f. The fact that the isolation material still partially covers the first contact layer on its side facing away from the carrier layer reduces the risk that the active zone in semiconductor function region 2 will be free of isolation material after the structuring or structured application of the isolating material. All in all, therefore, this reduces the risk that the active zone will short circuit across a connecting conductor material 8 that is subsequently to be placed in gap 9.

Connecting conductor material 8 contains for example a metal, particularly Sn, and is preferably introduced into gap 9 in such fashion as to fill it substantially completely with said connecting conductor material. Tin-containing materials, particularly Sn, are particularly suitable as connecting conductor material, since, particularly if the lateral dimensions of the gap are relatively small, they "infiltrate" the gap on their own, for example due to capillary forces, and/or can fill it completely.

The connecting conductor material can be introduced into the gap by galvanic filling, vapor phase filling or solder alloying. In addition, suitably shaping the edge, for example modeling, particularly rounding, the edge of the gap by wet or dry chemical etching, can facilitate the infiltration of a liquid connecting conductor material, particularly Sn, into the gap.

The connecting conductor material is preferably arranged in the vertical direction such that it extends from the side of the semiconductor function region comprising the first contact layer through the region of the active zone of the semiconductor function region. Particularly preferably, however, the connecting conductor material is arranged in the gap so that it extends on into the carrier layer. For example, the connecting conductor material fills up the gap. In the region of the first contact layer, which is free of isolation material 10, the connecting conductor material is electrically conductively connected to the first contact layer.

Figure 4G:
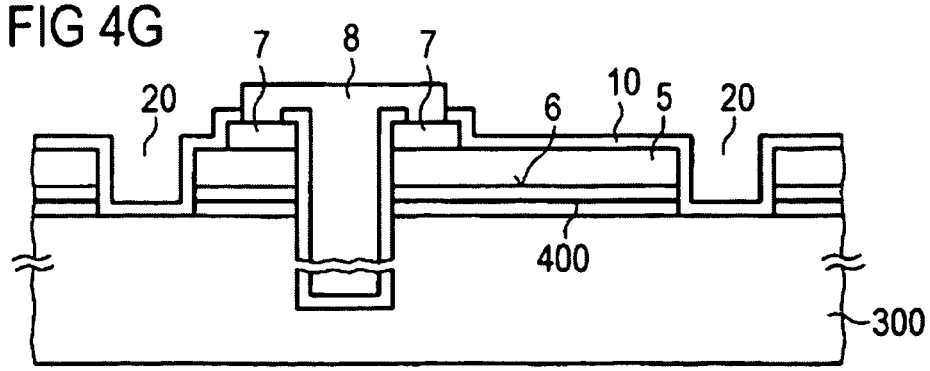

The resulting structure is illustrated schematically in sectional view in FIG. 4g. Semiconductor function region 2 is electrically conductively connected, on the side comprising first main face 6, to connecting conductor material 8 via first contact layer 7. Isolation material 10 forms, layer-like, around semiconductor function region 2 or current spreading layer 5 in subregions and additionally constitutes an advantageous protective or passivating layer for the semiconductor function region, particularly in the vertical direction in the edge region of the semiconductor function region. Furthermore, the isolation material is implemented as electrically isolating with respect to the active zone and the connecting conductor material and advantageously prevents the active zone from short circuiting through the connecting conductor material during the subsequent operation of the component.

In an ensuing method step, applied, preferably with full coverage, from the side of the semiconductor function regions located oppositely from the carrier layer is an envelope 4 that at least partially envelops the semiconductor function regions and can in particular be disposed in the interspaces 20 between two semiconductor function regions (FIG. 4h). The envelope can be applied for example by spin coating, vapor deposition, sputtering. A BCB containing envelope 4, for example, can be provided by spin coating.

The envelope is preferably applied in a liquid and/or plastically formable phase and subsequently converted to a solid, mechanically stable phase, which can be effected for example by temperature elevation and partial or complete curing of the envelope material. This can preferably be done at temperatures that are not damaging to the semiconductor function region. The temperature involved is preferably below 300° C., particularly preferably below 200° C.

Disposed after the envelope, as viewed from the semiconductor function region, is a window layer 170. The window layer, like the envelope 4, is preferably implemented as radiation-transparent to the radiation to be generated or received by the semiconductor function region and is further preferably distinguished by high mechanical stability. Window layer 170 can thus, possibly in cooperation with envelope 4, constitute a stabilization layer for the semiconductor function regions on carrier layer 300. Envelope 4 and window layer 170 are advantageously made of the same material and/or configured in one piece, thus making it unnecessary to additionally apply a stabilization layer. The envelope is instead implement as a stabilization layer and as a window layer in this case.

A radiation-transparent resist, such as an aluminum-oxide-containing resist, which can be applied by spin coating and then cured, is particularly well suited for this purpose due to its high radiation-transparency and high mechanical stability. The option of configuring the stabilizing window layer and the envelope in one piece is indicated in FIG. 4h by the broken line.

It is also, however, possible to provide a separate window layer 170, for example a glass plate, which is connected, preferably mechanically stably, to the envelope 4. This can be effected for example via an adhesive bond, which particularly preferably is formed by means of an envelope 4 that promotes adhesion to the window layer, thereby eliminating the need for an additional adhesion promoting layer. This adhesion promoting envelope can for example contain a silicone or a BCB.

Such a stabilization layer, formed of the envelope and/or the window layer, can advantageously stabilize the entire wafer composite, comprising the semiconductor function regions and the carrier layer, in such fashion as to eliminate the need for carrier layer 300 mechanically stabilizing the semiconductor function regions, and allowing it to be at least partially removed or thinned.

Particularly preferably, the stabilization layer has such a stabilizing effect that the entire carrier layer can be removed. This simplifies the production of very thin optoelectronic components.

FIG. 4h provides a schematic sectional view of the resulting structure having a greatly thinned carrier layer 300. The stabilizing effect of the envelope and the window layer has been made clear by orienting the structure with a 180° rotation relative to FIG. 4g. The carrier layer is preferably thinned at least to an extent such that the connecting conductor material in the gap 9 is electrically connectable from the second main face 13 of semiconductor function region 2. The thinning or complete removal of the carrier layer can be effected for example by grinding or other, for example mechanical or chemical, structuring methods, such as etching.

The structure shown in FIG. 4h can then be structured, working from the second main face 13 of the semiconductor function regions, such that carrier layer 300 and/or isolation material 10 are removed in the region of the interspaces 20 (FIG. 4i). This can be effected for example by masking and etching. The structuring is preferably taken at least to or into the material of envelope 4, for example by completely removing the carrier layer regionally. The region from which the carrier layer is removed can extend, preferably all the way, around the semiconductor function region.

Before or after this structuring, working from the second main face 13 side of the semiconductor function region, an isolation layer 10a is provided, followed as viewed from the semiconductor function region by a first interconnect 11, which when the carrier layer is completely removed is electrically isolated by isolation layer 10a from second interconnect 12, which is applied to the carrier layer or semiconductor function region on the side comprising the second main face. Semiconductor function region 2 is conductively connected via connecting conductor 8 to first interconnect 11, as is current spreading layer 5 on the side nearer first main face 6, whereas the second main face 13 of the semiconductor function region is conductively connected to second interconnect 12, optionally via carrier 3 derived from the structured carrier layer.

An encapsulating material 180 is then provided, working from the second main face 13 of the semiconductor function region. The encapsulating material is preferably disposed so as to make direct contact with envelope material 4. The encapsulating material can for example be spin coated on and then optionally cured.

In the region of the interconnects 11 and 12 for contacting the optoelectronic component, the encapsulating material, which is preferably initially applied with full coverage, is given a structure that allows solder layers 14 and 15 to be applied to the interconnects. For example, the encapsulating material is removed or gapped regionally over interconnects 11 and 12. The encapsulating element is advantageously fashioned for this purpose as photostructurizable so that an additional photoresist layer is unnecessary. The solder layers 14, 15, for example containing AuGe, are preferably electrically conductively connected to interconnects 11 and 12 and/or can be produced by vapor deposition or a galvanic process.

The resulting structure is depicted in schematic sectional view in FIG. 4i. If singulation is performed, for example on film, along the broken lines 21 shown in FIG. 4i, the result is a component that can be produced completely on the wafer level, is electrically connectable from a main face and has an encapsulation that is hermetically tight with respect to the active zone. In particular, the component is fashioned as surface-mountable.

The singulation is performed in this case through the stabilization layer, particularly the envelope, optionally through the window layer and the encapsulating element. Separating tracks, e.g. saw tracks, can be formed in said elements for purposes of singulation.

An optical element, such as for example a lens corresponding to the component shown in FIG. 2 or a microstructure that enhances the incoupling or outcoupling of light, can also be formed on-wafer in the window layer 170, for example by means of a microlithographic process, for instance etching, or by punching.

It should be noted that a stabilization layer that stabilizes the wafer composite can also be put to multiple use. A first stabilization layer, which is preferably photostructurizable, can be removed after the application and optionally the curing of a second stabilization layer. It is expedient to remove the first stabilization layer after the second stabilization layer has been cured and to dispose it on the side of the semiconductor function region opposite from the first stabilization layer.

The method sketched out here with reference to the exemplary embodiment naturally is not limited to that exemplary embodiment.

Furthermore, alternatively or additionally a mirror layer, particularly metal-containing, can be applied to the side of the semiconductor function region facing away from carrier layer 300, and the semiconductor layer sequence can, on the mirror side, subsequently be disposed on and/or attached to a supplemental carrier layer, for instance by gluing or a wafer bonding process. The carrier layer can then be removed, so that a mirror layer is disposed between the supplemental carrier layer and the semiconductor layer sequence. The supplemental carrier layer and/or the mirror layer can be processed during the subsequent phases of the method analogously to the carrier layer from FIG. 4. The growth substrate of the semiconductor layer sequence, which can be encompassed by the carrier layer, is preferably removed in this case (see the exemplary embodiment illustrated in FIG. 7, in which the carrier 3 is then derived from the supplemental carrier layer on singulation, as described above).

A device comprising a plurality of optoelectronic components can further be produced according to this method.

FIG. 5 shows an exemplary embodiment of an inventive device in schematic sectional view.

Interconnects 11 and 12 of the, for example three, optoelectronic components 1 arranged side by side in the lateral direction are each conductively connected to external interconnects 23 and 24. The arrangement of the optoelectronic components corresponds to that of the semiconductor function regions 2 in the wafer composite. The illustrated device is mechanically stabilized and protected against harmful external influences by the one-piece, continuous envelope 4 and/or the encapsulation 16 formed by encapsulating element 18. Such a device can be derived from the structure illustrated in FIG. 4i if that structure is singulated such that the derived optoelectronic component or subsequently the device comprises a plurality of semiconductor function regions which in particular can be arranged planarly, as an array. For purposes of clarity, the active zone of the semiconductor function regions is not shown in the diagram.

As stated above, the carrier 3 of the semiconductor function regions can also be dispensed with if the envelope 4 is suitably implemented as a stabilization layer or if an additional stabilization layer, for example a window layer, is also provided.

If the encapsulating element is implemented as sufficiently thin, the creation of high-performance components or an array of high-performance components is facilitated, since this improves the dissipation of the lost heat generated during operation through the encapsulating element to, for example, an external heat sink on which the high-performance component can be disposed and/or to which it can be attached. The high-performance component can be implemented for example as a laser or a high-performance light-emitting diode.

The external interconnects that conductively unite the individual semiconductor function regions can optionally be integrated into the composite shown in FIG. 5, particularly into the encapsulating element, by lithography, particularly microlithography, whereby a small and compact configuration for the device can be attained in a simple manner. To this end, for example the surface of the encapsulating element facing away from the semiconductor function regions can be suitably structured and the external interconnects can be disposed, for example as metallizations, in the structure so formed. The metallization can be performed for example by means of a galvanic process.

Furthermore, a plurality of devices or a device comprising one or more individual optoelectronic components can be conductively united. The device and the component can optionally be operated in common.

An optoelectronic component substantially equivalent to that illustrated in FIG. 3 can also be produced according to a method that is slightly modified with respect to that illustrated in FIG. 4. For this purpose, the connecting conductor material and the isolation material are disposed for example in the region of the opening through the active zone, in the interspaces 20 of FIG. 4b. The edge regions of the semiconductor function regions are preferably suitably stepped or beveled to facilitate the disposition of the isolation material and/or the connecting conductor material. The carrier layer is preferably completely removed from the structure maintained by the stabilization layer, so that subsequently a metal-containing, particularly metallic, mirror layer can be applied to the semiconductor function region on the side comprising the second main face.

A thereto-corresponding exemplary embodiment of a production method for an optoelectronic component is illustrated in FIG. 6 by means of intermediate steps depicted schematically in FIGS. 6a to 6e.

Figure 6A:
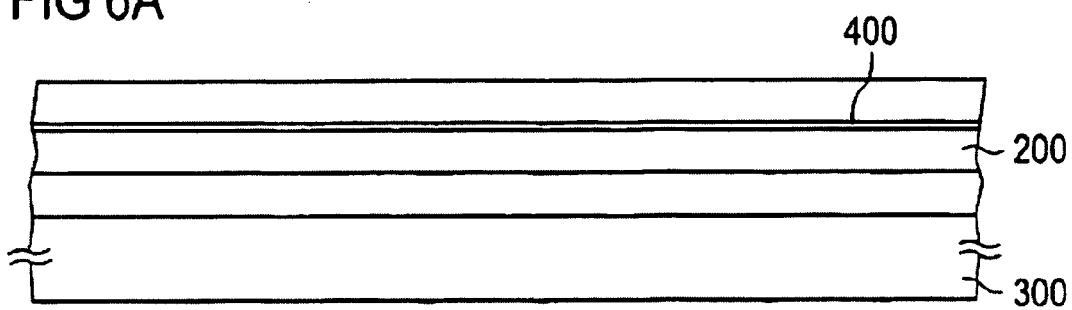
FIG. 6 shows a second exemplary embodiment of an inventive method for producing an optoelectronic component by means of intermediate steps illustrated schematically in FIGS. 6a to 6e.

First, as illustrated by the sectional view shown in FIG. 6a, a wafer composite is prepared comprising a semiconductor layer sequence 200 disposed on a carrier layer 300 and including an active zone 400 provided to generate or receive radiation. The carrier layer can for example be constituted by the growth substrate on which the semiconductor layer sequence was epitaxially grown.

Figure 6B:
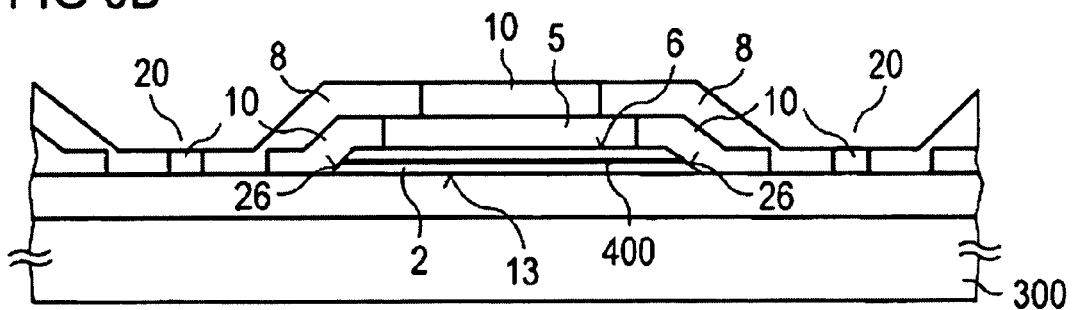
Figure 6C:
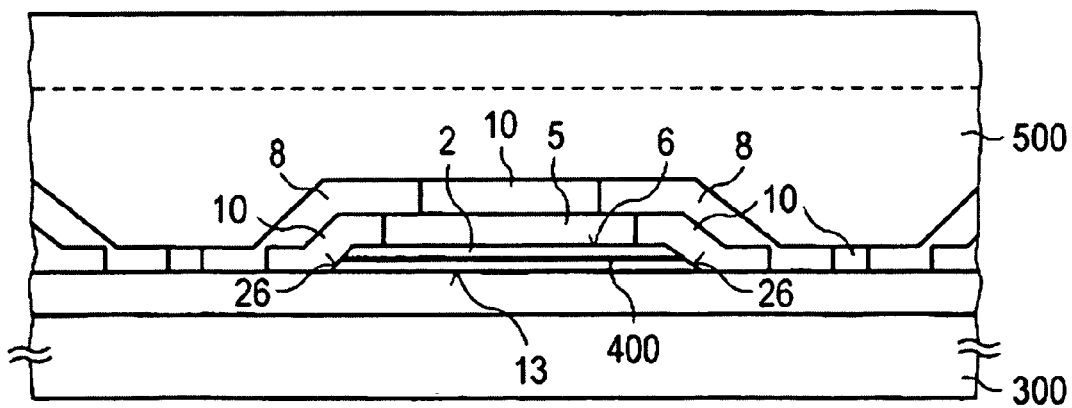
Figure 6D:
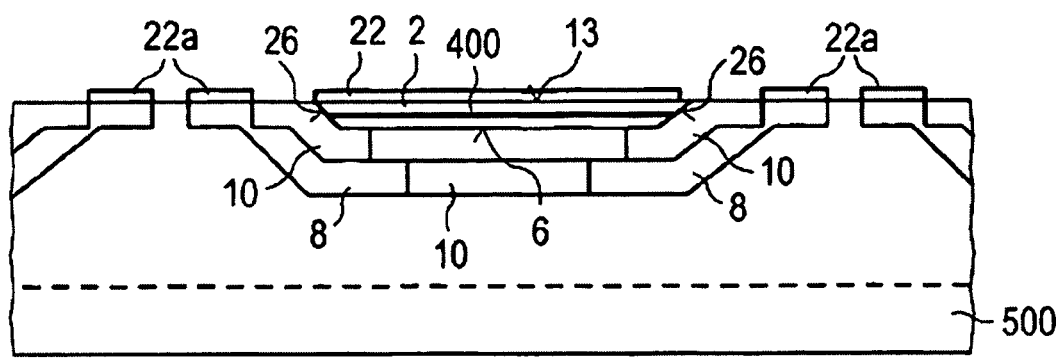

Next, the semiconductor layer sequence 200 is structured, for example by a photolithographic process in combination with an etching process, into a plurality of semiconductor function regions 2 spatially separated from one another by interspaces 20 (see FIG. 6b). The side faces 26 laterally bounding the active zone of the semiconductor function regions are formed during this operation. For purposes of clarity, only one semiconductor function region 2 is shown in FIG. 6.

A current spreading layer 5, for example containing ZnO:Al, is applied to the semiconductor function regions 2 or to the still-unstructured semiconductor layer sequence 200 (FIG. 6b). Sputtering, for example, is particularly well suited for this purpose. If the current spreading layer is applied to the unstructured semiconductor layer sequence, then it can be applied structured with the desired structure for the semiconductor function regions, or with full coverage and unstructured. In the latter case, the structuring of the semiconductor layer sequence in the semiconductor function regions and the current spreading layer can be performed in one method step, for example using a common mask.

It should be noted that the current spreading layer need not necessarily contain a TCO material. Alternatively or additionally, a metal-containing, particularly metallic and/or absorbing, current spreading structure can optionally be provided that can be configured for uniform current impression in the active zone. Uniform current impression can be achieved by suitably configuring the current spreading structure, for example with metallic fingers extending outward from a metallic central region and/or a metallic framing structure that extends, preferably completely, around the edge region of the semiconductor function region. The current spreading structure preferably does not completely cover the surface of the semiconductor function region facing away from the carrier layer, so that at least a subregion of the surface, particularly first main face 6, of the semiconductor function region is free of the current spreading structure.

Uniform current impression in the semiconductor function region can be achieved in this way, accompanied by moderate absorption in the regions of the active zone covered or shaded by the structure and substantially complete transmission of radiation into the regions of the surface of the semiconductor function region that are free of the structure.

An isolation material 10, such as a silicon nitride, a silicon oxide or a silicon oxynitride, is then disposed in the region of side faces 26.

The isolation material preferably extends, particularly directly, along side face 26 of semiconductor function region 2, from the first main face 6 of the semiconductor function region, i.e. that located oppositely from carrier layer 300, and vertically on past the active zone toward or to the carrier layer. The isolation material is preferably initially applied with full coverage, for example by sputtering, and is then removed regionally from a region overlapping with the surface of the semiconductor function region, particularly of the current spreading layer, that faces away from the carrier layer, and/or from the region of the interspaces 20. The beveling of the semiconductor function region or the stepped portion provided between the current spreading layer and the semiconductor function region facilitates the application of the isolation material and reduces the risk of cracking in the isolation material layer formed by the isolation material.

A connecting conductor material 8, for example containing Ti, Pt, Au or an alloy comprising at least one of these metals, is disposed in the regions from which the isolation material has been removed and is electrically conductively connected via the current spreading layer to the semiconductor function region on the side comprising its first main face 6. A suitable method for this purpose is for example vapor deposition, particularly using a suitably configured mask.

In the edge region of the semiconductor function region, the connecting conductor material extends along the isolation material and side faces 26 past the region of active zone 400 to the second main face 13 of semiconductor function region 2. The isolation material prevents direct contact, causing short circuits, between the connecting conductor material and the active zone.

The side of the structure illustrated in FIG. 6b that faces away from the carrier layer can optionally also be provided with an antireflection coating or other type of optical finish comprising a plurality of layers. An antireflection coating can reduce excessive jumps in refractive index at the interface with a subsequently to be applied material, which are associated with reflection losses from a radiation to be emitted or received by a completed optoelectronic component. The isolation material can in particular be implemented as an antireflection layer, for example a $\lambda/4$ layer.

A radiation-transparent stabilization layer 500 is then disposed on the structure from FIG. 6b, working from the side of the semiconductor function regions 2 facing away from the carrier layer 300. For example, the stabilization layer is applied by spin coating and then solidified for example by subsequent, particularly thermal, curing. A spin-on oxide or a resist is particularly suitable as a material for the stabilization layer. The stabilization layer is preferably configured in one piece. Optionally, the stabilization layer can also be configured in two or more pieces, for example formed of a window layer and an envelope, preferably one that promotes adhesion to the window layer, for instance according to the exemplary embodiment described in conjunction with FIG. 4. This is indicated by the broken line in the schematic sectional view of FIG. 6c.

The stabilization layer partially forms around the semiconductor function regions and stabilizes the wafer composite mechanically such as to eliminate the need for the carrier layer. The carrier layer is subsequently removed completely, for example by means of an etching process or a laser ablation or laser cutting process, rendering the composite accessible for further processing from the side of the semiconductor function regions comprising second main face 13.

A mirror layer 22, particularly an electrically conductive one, for example containing a metal or an alloy, such as AuGe, is then disposed on the semiconductor function region on the side of the composite facing away from the stabilization layer. The resulting structure is illustrated in schematic sectional view in FIG. 6d.

The mirror layer 22 can be applied for example by vapor deposition or sputtering, particularly by means of a suitably configured mask. The mirror layer is preferably applied such that layers 22a of the material of the mirror layer whose thickness is particularly preferably comparable or identical to that of the mirror layer can be disposed on the bare connecting conductor 8 on the side comprising the second main face. The mirror layer is conductively connected to the semiconductor function region on the side comprising its second main face 13, as is layer 22a on the side comprising its first main face 6. The use of comparable, particularly identical, thicknesses for the mirror layer and layer 22a makes it possible to give the structures—the mirror layer and layer 22a—intended for the electrical contacting of the subsequent component a uniform elevation over the semiconductor function region, which facilitates the application of subsequent structures, e.g. ones also serving for contacting. AuGe is distinguished by particularly advantageous electrical contact properties to semiconductor materials, particularly III-V materials, for example GaP-based such materials, on the one hand, and to metal-containing materials such as the connecting conductor material on the other hand, while simultaneously possessing high reflectivity.

The mirror layer is advantageously implemented as reflective of a radiation to be generated or received by the semiconductor function region. The efficiency for example of a radiation emitting component can thus be increased as a result of enhanced and more directional outcoupling of radiation from the component.

An additional isolation material 10a is then disposed, preferably initially with full coverage, on the side of the composite located oppositely from the stabilization layer. The material is preferably identical to the isolation material 10 and/or the additional isolation material 10a contains a silicon nitride, a silicon oxide or a silicon oxynitride. An isolation material 10a that is initially applied with full coverage can be removed regionally, for example by wet or dry chemical etching, from [a] region overlapping with connecting conductor material 8 or semiconductor function region 2. A solder material can then be disposed in the stripped regions in such fashion that a first solder layer 14 and a second solder layer 15 are formed. The first solder layer is conductively connected to the semiconductor function region on the side comprising the first main face—via layer 22a, connecting conductor material 8 and current spreading layer 5—and the second solder layer is conductively connected via the mirror layer 22 to the semiconductor function region on the side comprising second main face 13.

Figure 6E:
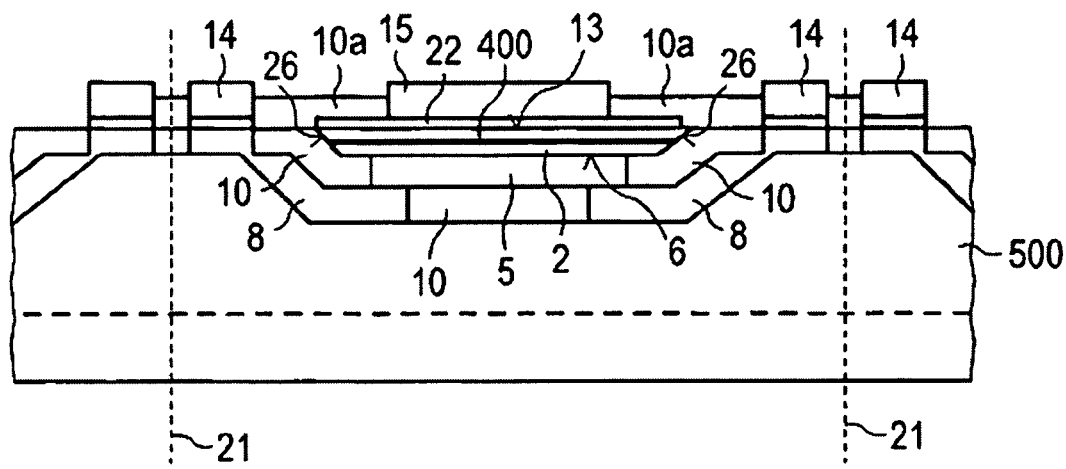

As illustrated by the schematic sectional view of FIG. 6e, the semiconductor function region is surrounded on all sides by protective structures, particularly the isolation materials 10 and 10a and the mechanically stable stabilization layer, and is therefore encapsulated, for example hermetically. The encapsulation is omitted only in subregions, for contacting purposes.

Singulation can be performed, for example by sawing or on film, along lines 21 to yield optoelectronic components provided with a single semiconductor function region or a device having a plurality of semiconductor function regions. This singulation takes place in the region of the interspaces 20 and particularly through the stabilization layer and the isolation materials 10.

The component or device is therefore fabricated completely on wafer, and because of the hermetic encapsulation, there is no need for an additional protective housing. For purposes of further protection, an additional encapsulating element, for example similar to element 180 from FIG. 4, can be provided while still in the on-wafer phase. However, since the component is to be contacted or mounted on a carrier board, for example a printed circuit board, on the side comprising the second main face and this mounting side is not exposed to harmful external influences nearly as much as the first main face, such an additional encapsulating element can be omitted without significantly increasing the risk of damage to the component.

The encapsulation of the semiconductor function region can be further sealed by, particularly internally, bonding the additional isolation material 10a to the solder material during the mounting, particularly the surface mounting, of the thin film component, for example by soldering it to a printed circuit board.

It should be noted that in the method according to FIG. 6, an optical element can also be formed in the stabilization layer or a luminescence conversion material can be disposed in the material of the stabilization layer. Additional features described in the preceding exemplary embodiments can also pertain to the method according to FIG. 6.

FIG. 9 illustrates different variant implementations of the contact structure for electrically contacting the semiconductor function region, in schematic sectional and plan views presented in FIGS. 9a to 9i.

The elements illustrated in FIG. 9 can all be fabricated entirely on-wafer.

Figure 9A:
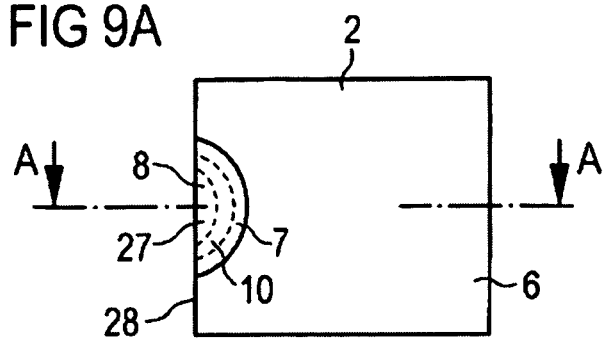
FIG. 9 shows variant implementations of the contact structure for electrically contacting the semiconductor function region in schematic sectional and plan views given in FIGS. 9a to 9i.
Figure 9B:
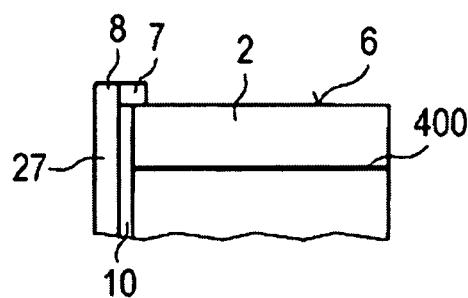

FIG. 9a shows a schematic plan view of the first main face 6 of the semiconductor function region 2 and FIG. 9b shows a corresponding schematic sectional view of a section along line A-A.

In FIGS. 9a and 9b, the opening through the active zone 400 of the semiconductor function region 2 is configured as a lateral depression 27. Depression 27 is fashioned in particular as an indentation in a side face 28 of semiconductor function region 2. The isolation material 10 isolates active zone 400 from the connecting conductor material 8 disposed in the lateral depression and connected electrically conductively, on the side nearer the first main face 6 of the semiconductor function region, to the first contact 7. In the vertical direction, the connecting conductor material extends along the semiconductor function region in the direction of the second main face, which is located oppositely to the first main face 6 relative to the active zone, or in the direction of the carrier layer of the wafer composite. The carrier wafer and the second main face are not depicted explicitly in FIGS. 9a and 9b (in this regard, see the exemplary embodiments described above in more detail). The variant shown here is particularly suitable for a component according to the exemplary embodiments depicted in FIGS. 1, 2, 7 and 8, but can optionally also be used with a component according to FIG. 3.

Figure 9C:
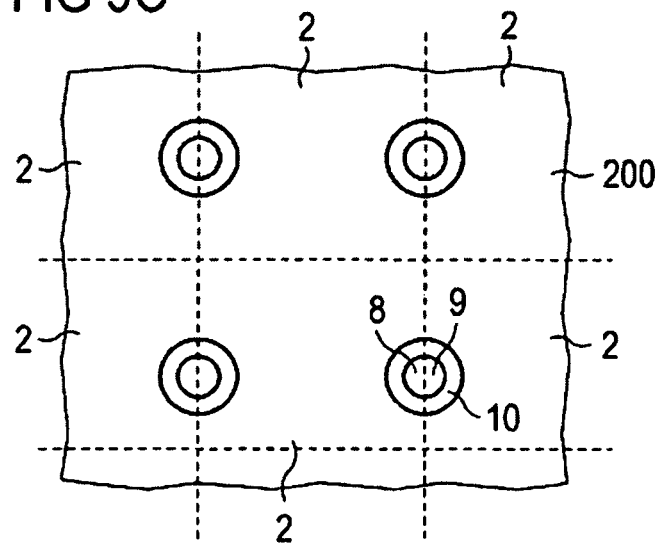

In the production of such a contact structure, the semiconductor layer sequence 200 of the wafer composite can first be provided with openings preferably fashioned as gaps 9 that are preferably bounded laterally on all sides by the semiconductor layer sequence (see the schematic plan view of a wafer composite shown in FIG. 9c). The openings are then preferably filled with connecting conductor material 8. Particularly preferably, an isolation material 10 is disposed beforehand in the region of the opening, and can cover a wall of the opening and/or electrically isolate the perforated active zone from the connecting conductor material. This can be followed by structuring the semiconductor layer sequence 200 into semiconductor function regions 2. In this case the structuring is preferably carried through the openings such that the semiconductor function regions 2 comprise a depression in the lateral direction, for example according to FIGS. 9a and 9b. This is indicated in FIG. 9c by the broken lines along which the semiconductor layer sequence is preferably structured into semiconductor function regions 2.

The disposition of connecting conductor material 8 and/or isolation material 10 in the region of the openings can optionally be performed in this case after the semiconductor layer sequence has been structured into semiconductor function regions.

Figure 9D:
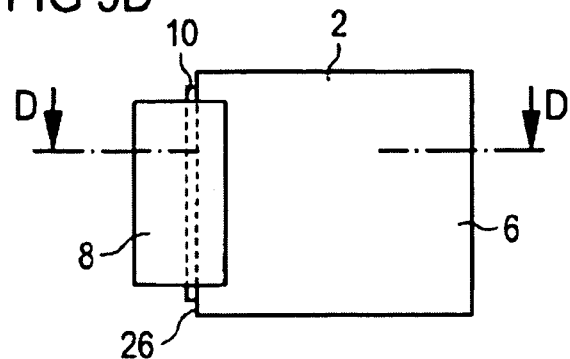
Figure 9E:
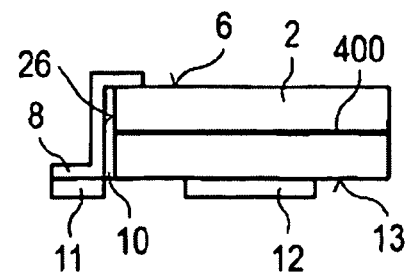

In contrast to the above described variant, in the variant represented in plan view in FIG. 9d and in a sectional view along line D-D in FIG. 9e the semiconductor function region 2 does not have a depression in the lateral direction. The isolation material 10 is disposed at a planar side face 26 laterally bounding the active zone 400. The connecting conductor material 8 is electrically conductively connected to the first main face 6 and extends in the vertical direction to the second main face 13 of the semiconductor layer sequence 2. On the side nearer the second main face, the connecting conductor material is electrically conductively connected to the first interconnect 11. The need for any direct electrical contact between the connecting conductor material 8 or first interconnect 11 and the second main face 13 is eliminated by isolation material 10. The second main face is electrically conductively connected to second interconnect 12. To further reduce the risk of short circuiting of the active zone, isolation material 10 preferably has a greater extent in a direction parallel to side face 26 than does connecting conductor material 8. Such a contact structure is particularly suitable for example for a component as depicted in FIG. 3.

In contrast to the component illustrated in FIG. 3, in FIGS. 9d and 9e the connecting conductor material extends in the vertical direction on one side, i.e., along a single side face 26 of semiconductor function region 2.

Figure 9F:
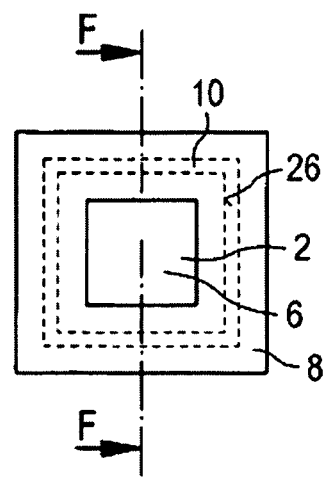
Figure 9G:
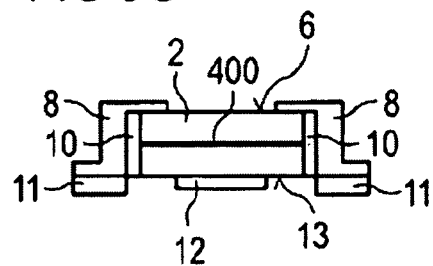

Differently therefrom, in the variant illustrated in a schematic plan view in FIG. 9f and a schematic sectional view along line F-F in FIG. 9g, the connecting conductor material is disposed laterally all around semiconductor function region 2.

Figure 9H:
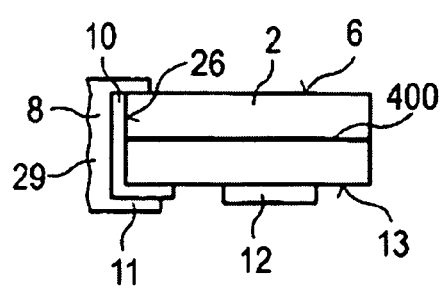

FIG. 9h is a sectional view of a further variant of the contact structure. Connecting conductor material 8 is electrically conductively connected to the first main face 6 of the semiconductor function region, and on the side nearer the second main face is isolated by isolation material 10 from direct electrical contact with semiconductor function region 2 via its second main face 13. On the side nearer the second main face, the connecting conductor material forms a first interconnect 11. Optionally, a separate first interconnect and/or a separate additional isolation material can be provided instead of configuring either first interconnect 11 and/or connecting conductor material 8 in one piece (see in this regard FIG. 1, for example). The opposite pole of the diode contact forms the second interconnect 12, which is electrically conductively connected, particularly directly, to second main face 13. Connecting conductor material 8 embraces semiconductor function region 2 preferably in a pincer-like manner. If the connecting conductor material is disposed through active zone 400 in the region of an opening 29, then the illustrated contact structure is particularly suitable for a component according to FIG. 1, 2, 7 or 8. If the connecting conductor material extends along a side face 26 bounding the active zone in the lateral direction, then the contact structure illustrated in FIG. 9h is particularly suitable for a component according to FIG. 3.

Figure 9I:
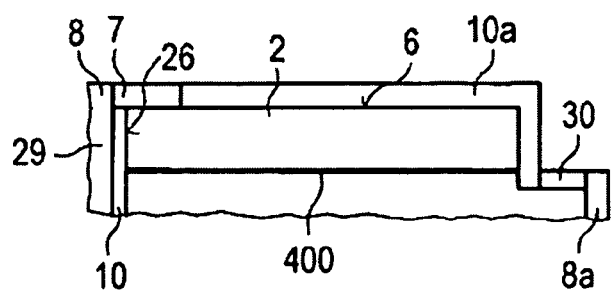

FIG. 9i schematically illustrates a further variant of the contact structure of the semiconductor function region 2 in sectional view.

In contrast to the other contact structures illustrated in FIG. 9, here the first contact 7 and a second contact 30 are disposed on a common side of semiconductor function region 2, particularly on the side facing away from the carrier layer in the wafer composite or away from a carrier of the component. To enable the semiconductor function region to be contacted on its side comprising the second main face (not shown), a connecting conductor material 8 connected to the first contact and isolated from active zone 400 via isolation material 10 extends in the direction of the second main face, and an additional connecting conductor material 8a connected to second contact 30 extends in the direction of the second main face. In addition, disposed on first main face 6 is an additional isolation material 10a, which exerts both a protective and a passivating effect on semiconductor function region 2, particularly on its flanks, and also reduces the risk of the active zone short circuiting across second contact 30.

The semiconductor function region or semiconductor layer sequence can be structured, for example by suitable etching on-wafer, such that the active zone, as illustrated in FIG. 9i, is electrically contactable by means of contacts 7 and 30 disposed on a common side of the semiconductor function region. Contacts 7 and 30 are electrically conductively connected to active zone 400, particularly from different sides of the active zone.

Connecting conductor material 8 can extend either in the region of opening 29 or along the side face 26 laterally bounding the active zone, the opening preferably being fashioned as a gap in the semiconductor function region, which is bounded laterally on all sides by the semiconductor function region.

FIG. 10 shows a third exemplary embodiment of an inventive method for producing an optoelectronic component by means of intermediate steps schematically illustrated in FIGS. 10a to 10k.

Figure 10A:
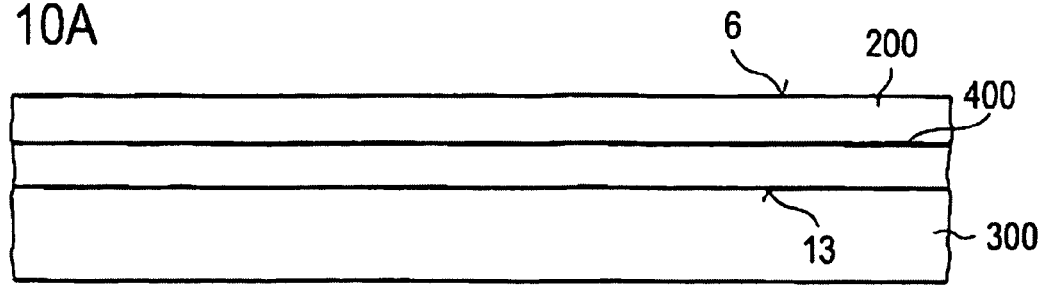
FIG. 10 shows a third exemplary embodiment of an inventive method for producing an optoelectronic component by means of intermediate steps illustrated schematically in FIGS. 10a to 10k and FIG. 11 shows a fourth exemplary embodiment of an inventive method for producing an optoelectronic component by means of intermediate steps illustrated schematically in FIGS. 11a to 11g.
Figure 10B:
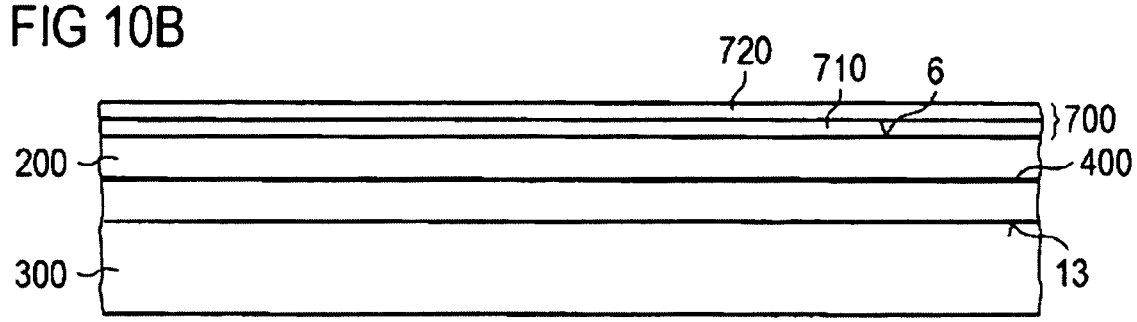
Figure 10C:
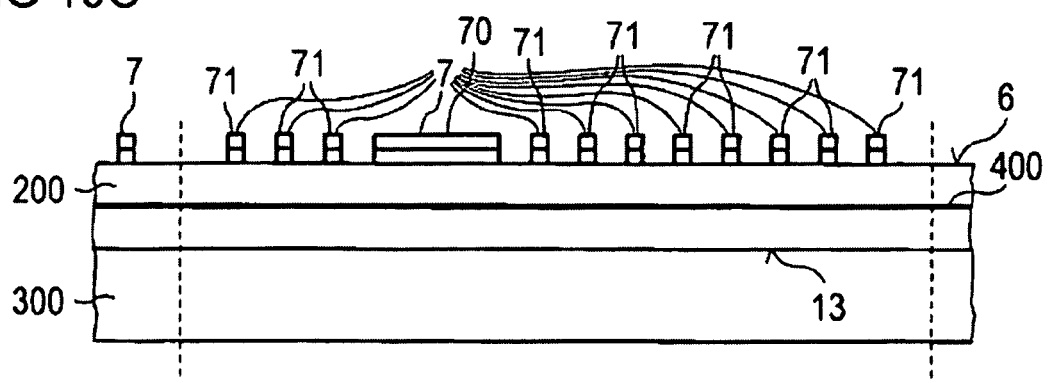

First, as illustrated by the schematic sectional view of FIG. 10a, a semiconductor layer sequence 200 disposed on a carrier layer 300 and comprising an active zone 400 provided to generate or receive radiation is prepared on-wafer.

The carrier layer 300 is preferably formed from the growth substrate on which semiconductor layer sequence 200 was epitaxially grown. The semiconductor layer sequence is for example based on GaN. A SiC or sapphire carrier layer is particularly suitable as a growth substrate for this purpose. However, sapphire-containing growth substrates are usually less expensive than silicon-carbide-containing growth substrates, although sapphire often has a much lower electrical conductivity than SiC. If the carrier layer 300 is removed in the course of the production process and/or if the carrier layer is not involved in the electrical contacting of the optoelectronic component to be produced, then it is expedient to use a sapphire substrate.

The semiconductor layer sequence, particularly the active zone, preferably contains InGaN. Furthermore, for purposes of efficient radiation generation or reception, the active zone can be fashioned as a multiple quantum well structure.

The thickness of the semiconductor layer sequence can be for example 10 µm or less, preferably 6 µm or less.

Semiconductor layer sequence 200 further comprises a first main face 6 and a second main face 13 disposed oppositely from the first main face relative to the active zone 400, the semiconductor layer sequence 200 being disposed via the second main face 13 side on carrier layer 300.

Thereafter (FIG. 10b), a first contact layer 700 is applied to the semiconductor layer sequence 200 on the side opposite from carrier layer 300, particularly to the first main face 6. Preferably first applied to the semiconductor layer sequence is a first layer 710 of first contact layer 700, which is advantageously particularly suitable for creating an electrical contact to the semiconductor layer sequence.

Applied thereafter to the first layer is a second layer 720 of contact layer 700, whose material, unlike that of the first layer, advantageously can be relatively freely selected. The material used for the second layer can in particular be less expensive than that of the second layer.

The first layer 710 is disposed between the semiconductor layer sequence 200 and the second layer 720. The contact layer 700 is applied to the semiconductor layer sequence 200 for example by vapor deposition.

A first layer 710 for example containing or comprised of Pt is particularly suitable for creating a good electrical contact to GaN-containing materials. To create a high-quality contact this layer can be fashioned as relatively thin, for example with a thickness of 100 nm, preferably 40 nm, or less. Particularly suitable for the second layer is for example an Au-containing layer. Au is relatively inexpensive in comparison to Pt. The second layer 720 preferably has a thickness that is greater than that of the first layer 710. Owing to its greater thickness, the second layer 720 preferably determines the current carrying capacity of the contact. The second layer preferably has a thickness greater than 500 µm, particularly preferably greater than 800 µm. A second layer with a thickness of 1000 µm has proven especially suitable.

The semiconductor layer sequence 200 preferably comprises different conduction types on the two sides disposed oppositely from each other relative to the active zone 400. For example, semiconductor layer sequence 200 is configured as p-conducting on the side opposite from carrier layer 300 and n-conducting on the side facing the carrier layer. This can be achieved by suitable doping of the semiconductor layer sequence, particularly during the epitaxy process. Pt is particularly suitable for forming electrical contacts to p-conducting materials based on GaN.

The first contact layer 700 is preferably applied with full coverage to substantially the entire surface of semiconductor layer sequence 200 facing away from the carrier layer.

Contact layer 700 is then structured (FIG. 10c) such that a plurality of first contacts 7 is formed. Structuring of this kind can be carried out for example by means of an etching process, such as wet or dry etching, and/or backsputtering, optionally in combination with a suitably configured mask, such as a photoresist or resin mask, particularly a metal mask. Etching is particularly suitable for structuring an Au-containing second layer 720, and backsputtering for structuring a Pt-containing first layer 710. In particular, a common mask can optionally be used to structure the first and second layers.

The first contact layer 700 is preferably structured into first contacts 7 such that substantially every region of the surface of the semiconductor layer sequence that is intended to constitute the surface of a subsequent semiconductor layer sequence is provided with at least one such first contact. An exemplary semiconductor function region comprising a first contact 7 is delimited in FIG. 10c by the broken lines.

Two preferably arbitrary first contacts disposed next to each other on the semiconductor layer sequence preferably have no direct electrically conductive connection to each other. The first contacts 7, particularly each of them, comprise a central region 70 and preferably at least one, particularly preferably a plurality, of subregion(s) 71 that are spaced apart laterally from the central region and are connected electrically conductively thereto.

Subregions of the surface of the semiconductor layer sequence spanned by the first contact can therefore in particular be free of any contact structure covering them; hence, radiation outcoupling through these subregions not covered by the first contact is not reduced by absorption in the first contact. This simultaneously results in areal, comparatively uniform current injection into active zone 400 through first contact 7, since a plurality of contact points, for example those formed by the subregions 71, is produced between the first contact and the semiconductor layer sequence. Since GaN-based semiconductor materials usually have a relatively low conductivity in the lateral direction, the contact points of the first contact are preferably arranged comparatively close together to produce uniform current flow laterally into the active zone. Uniform current flow into the active zone can optionally also be obtained through the use of a current spreading layer containing a radiation-transparent conductive oxide.

Figure 10D:
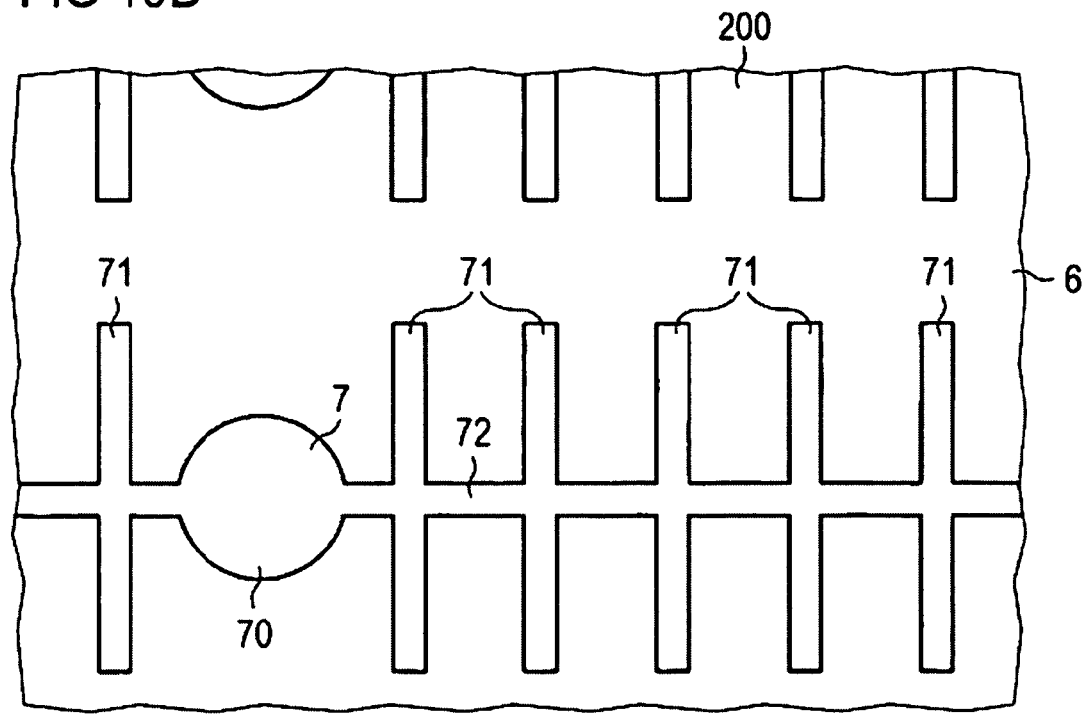
Figure 10E:
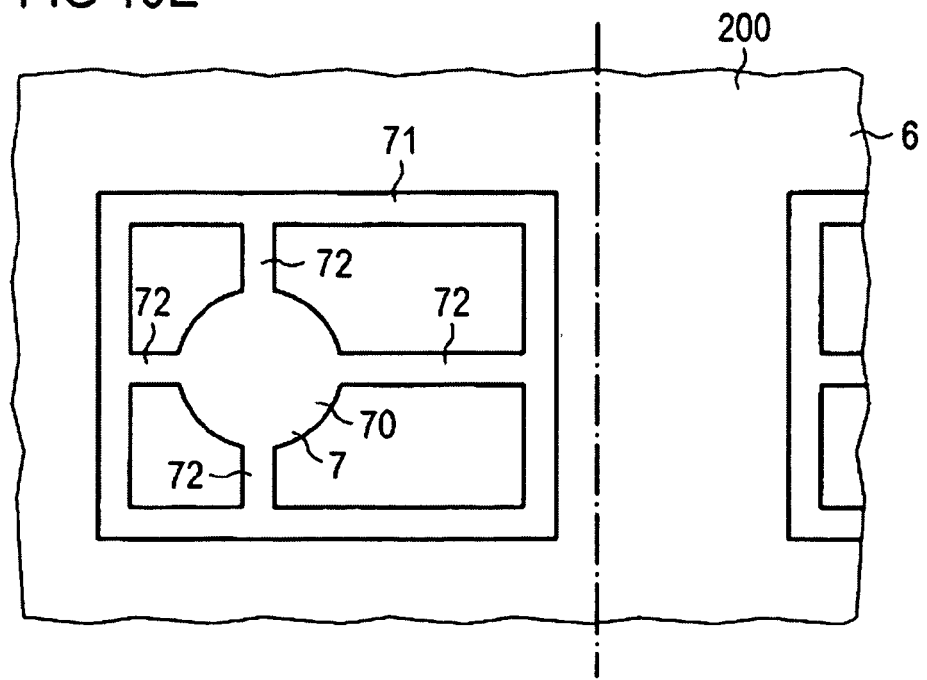
Figure 10F:
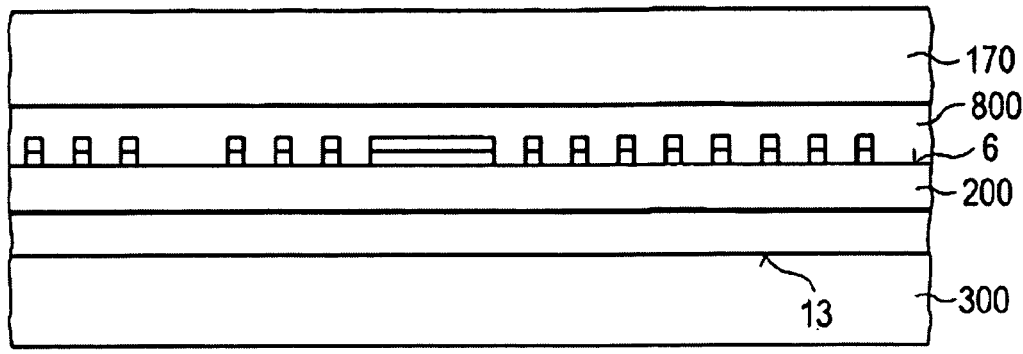

FIGS. 10*d* and 10*e*, which are schematic partial plan views of the first main face 6 of the semiconductor layer sequence 200, illustrate two variants of a first contact 7.

The subregions 71 are each connected via a land 72 to the central region 70.

In the variant of FIG. 10*d*, a common land 72 connects the subregions 71 extending outward finger-like from the land, particularly on both sides of the land, electrically conductively to the central region.

In the variant of FIG. 10*e*, by contrast, subregion 71 is fashioned as a frame that surrounds central region 70 and is connected electrically conductively to central region 70 via a plurality of lands 72 that extend outwardly, particularly radially, from the central region.

The broken lines in FIGS. 10*d* and 10*e* each delimit a region of semiconductor layer sequence 200 that is provided to form a semiconductor function region.

Alternatively to the implementations of the contact illustrated in FIGS. 10*d* and 10*e*, the first contact 7 can also be fashioned as a lattice contact, for example in the form of a regular lattice, for example a rectangular or square lattice. Different subregions 71 can therefore intersect at lattice points of the lattice. In this case, a lattice point is preferably configured as a central region 70 having a larger lateral extent than that of the subregions 71.

Thereafter (FIG. 10*f*), a window layer 170, for example a glass plate, particularly a boron silicate glass plate, is disposed after semiconductor layer sequence 200 on its side facing away from carrier layer 300, particularly on the side comprising first main face 6.

Window layer 170 is preferably attached to semiconductor layer sequence 200, particularly to the wafer composite, by means of an adhesion promoting layer 800, for example containing BCB.

Both window layer 170 and adhesion promoting layer 800 are preferably implemented as radiation-transparent to a radiation that is to be received or generated by active zone 400.

The adhesion promoting layer can be applied to the wafer composite or the window layer for example in the liquid phase, e.g. by spin coating. The window layer is then attached to the semiconductor layer sequence by means of the adhesion promoting layer 800. To bring this about, the window layer can for example be pressed, by the exertion of pressure, against the composite provided with the adhesion promoting layer. Adhesion promoting layer 800 is preferably distinguished by an adhesion promoting effect not only on semiconductor layer sequence 200 and/or first contact 7, but also on window layer 170. The adhesion promoting layer can optionally be partially or completely cured for example by a thermal method, e.g. by heating to a temperature between 200° C. and 300° C. The stability of the mechanical binding of the window layer to the semiconductor layer sequence or wafer composite can be increased in this way.

The adhesion promoting layer can have a thickness of 500 nm or less, preferably 300 nm or less. A thickness of about 100 nm has been found particularly suitable.

Window layer 170 can stabilize semiconductor layer sequence 200 mechanically in such fashion as to render the mechanically stabilizing action of carrier layer 300 unnecessary. To this end, the window layer is usefully implemented as self-supporting, particularly with a suitably large thickness. For example, the window layer has a thickness of 200 μm or less, preferably of 100 μm or less. The window layer is therefore preferably fashioned as a stabilization layer.

Figure 10G:
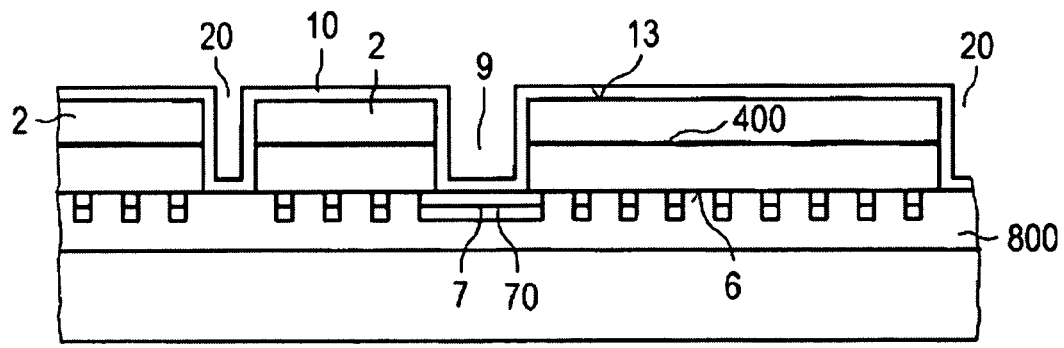

Owing to the stabilization layer that is now present, carrier layer 300 can subsequently be removed (FIG. 10*g*). This removal can take place for example via a laser liftoff process. Such a method is particularly suitable for removing a sapphire-containing carrier layer from a GaN-containing semiconductor layer sequence.

Due to the removal of the entire carrier layer 300, semiconductor layer sequence 200 is accessible to direct structuring over its full area on the side facing away from the stabilization layer, particularly the side comprising second main face 13, without the need to penetrate the carrier layer.

Alternatively, the carrier layer can optionally be thinned down or regionally removed, since its mechanically stabilizing effect is not needed. However, removing the entire carrier layer advantageously facilitates the fabrication of thin optoelectronic components.

In a further method step (FIG. 10*g*), the semiconductor layer sequence is structured, particularly working from its side facing away from the stabilization layer, such as to form a plurality of semiconductor function regions 2 spatially separated from one another by interspaces 20. Structuring of this kind can be performed by etching, for example wet or dry etching, optionally using a suitably configured mask, particularly a photoresist mask. To this end, the mask can be disposed on the second main face 13 and removed after the structuring. Dry etching is particularly suitable for creating relatively narrow interspaces, for instance having a lateral extent of 50 μm or less. Structures with a lateral dimension of 10 μm can be produced particularly efficiently by dry etching. Advantageously, the narrower the interspace, the smaller the loss of semiconductor material during structuring.

In addition, an opening is made through the active zones 400 of the semiconductor function regions 2, preferably in a common method step with the creation of the semiconductor function regions. The opening is preferably configured as a gap 9 in the semiconductor function region 2 concerned. The creation of the openings and the semiconductor function regions can advantageously be performed with the use of a common mask.

The opening through the active zone is usefully produced such that the gap 9 extends from second main face 13 to first main face 6, and first contact 7, particularly the central region 70 thereof, at covers the opening least partially, preferably completely. The structuring in this case can optionally be taken down into or to the first layer of first contact 7, i.e. the layer facing the first main face.

After the opening has been created, an isolation material 10 is applied to the composite (FIG. 10g), working from the side thereof facing away from the stabilization layer. The isolation material can for example contain or be comprised of $Si_3N_4$. Particularly suitable methods for applying the isolation material are, for example, sputtering or a PECVD process. The isolation material is preferably applied over the entire area of the side of the composite facing away from the stabilization layer. For example, the isolation material 10 forms an isolation layer particularly having a thickness of less than 500 nm, preferably of 400 nm or less. A thickness of 300 nm has proven particularly advantageous. The isolation material 10 preferably covers the wall of the gap substantially completely and has a protective and passivating effect on the flanks of the semiconductor function region with respect to the active zone 400, which is exposed at that location. Preferably substantially the entire exposed surface of semiconductor function region 2, particularly the entire exposed surface of the composite, is coated with the isolation material 10.

Figure 10H:
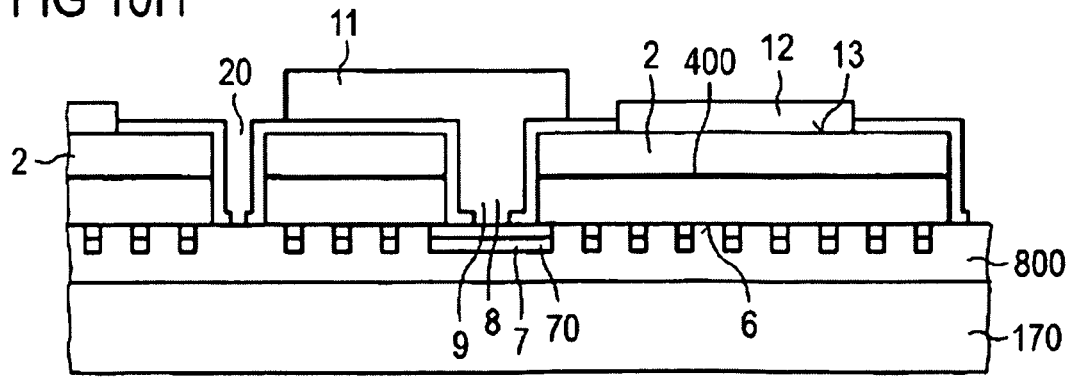

The isolation material is then removed regionally from the composite (FIG. 10h).

Preferably at least a subregion of first contact 7, in particular a subregion of the central region 70, of the semiconductor function regions is stripped of isolation material 10.

Furthermore, the isolation material 10 can also be removed regionally from the composite in the region of the interspaces 20 so as to expose the adhesion promoting layer 800 in the region of the interspaces. The isolation material is preferably removed from the interspaces laterally around the entire semiconductor function region 2, particularly each thereof, such that the adhesion promoting layer 800 is exposed circumferentially around the semiconductor function region 2 concerned. The lateral flanks of the semiconductor function region 2, however, preferably remain covered with isolation material 10 and therefore protected.

In addition, the isolation material 10 is preferably removed from the second main faces 13 of the semiconductor function regions 2 such that the second main face 13 of the semiconductor function region 2 concerned is exposed in a subregion.

These structurings of the isolation material 10 can be performed for example by etching, particularly wet or dry etching, optionally in combination with a suitably configured mask. Dry etching is particularly well suited for this purpose.

After the removal of the isolation material, a second interconnect 12, containing for example a metal such as Ti, Pt, Au, Al, Ag or an alloy comprising at least one of these materials, is disposed in the region of semiconductor function region 2 divested of isolation material, on the side comprising second main face 13, and is directly connected electrically conductively to the semiconductor function region on the side comprising the second main face.

Alternatively to the representation of FIG. 10, in which the second interconnect is configured as having one layer, second interconnect 12 can also be fashioned as multilayer, comprising a plurality of individual layers.

In a preferred embodiment, the second interconnect comprises a first interconnect layer implemented for efficient electrical contact formation from second main face 13 to the semiconductor material, and a second interconnect layer disposed on the side of the first interconnect layer located oppositely from the semiconductor material, for example from semiconductor function region 2. The second interconnect layer can protect the first interconnect layer. If, for example, a solder layer by which a component can be soldered to external interconnect means is applied to the side of the second interconnect layer facing away from the first interconnect layer, then the second interconnect layer advantageously protects the first interconnect layer against damage from the molten solder. The second interconnect layer can therefore be implemented as a barrier, particularly a solder barrier. The risk of damaging the electrical contact from the first interconnect layer to the semiconductor material is therefore reduced.

The first interconnect layer of the second interconnect can for example include two sublayers, e.g. a first sublayer, disposed on the side nearer the semiconductor material, and a second sublayer, disposed on the side of the semiconductor material located oppositely from the first sublayer.

Particularly suitable for GaN-based semiconductor materials is a first sublayer for example 3 nm thick and composed of Ti, followed by a second sublayer for example 200 nm thick and composed of Al. Moreover, a first interconnect layer comprising a titanium-containing first sublayer and an aluminum-containing second sublayer is particularly suitable for forming an efficient electrical contact to n-conducting GaN-based semiconductor materials.

The second interconnect layer of the second interconnect can also comprise a plurality of sublayers. A second interconnect layer having three sublayers is particularly suitable for GaN-based semiconductor materials. For example, disposed on the side comprising the first interconnect layer is a first, e.g. 50 nm thick, sublayer of Ti. Preferably disposed on this first sublayer is a second, e.g. 100 nm thick, sublayer of Pt, followed in turn by a third, e.g. 1000 nm thick, sublayer of Au. A second interconnect layer configured in this fashion is particularly suitable for use as a solder barrier.

In the region of the opening, a connecting conductor material 8, for example a metal, containing for example Ti, Pt, Au, Al, Ag, Sn or an alloy comprising at least one of these materials, is additionally disposed such that the connecting conductor material 8 is electrically conductively connected to the first contact 7 and thus to the first main face 6 of semiconductor function region 2. The connecting conductor material is preferably in direct mechanical contact with the first contact. The connecting conductor material can be disposed in the opening for example by vapor deposition. Au is particularly suitable for use as the connecting conductor material.

Gap 9 is preferably filled with connecting conductor material in such a way that the gap is filled up completely and the connecting conductor material forms on the side nearer second main face 13a first interconnect 11 whose lateral extent is preferably greater than that of the opening. The first interconnect and the connecting conductor can therefore particularly be implemented in one piece. The connecting conductor material 8 is electrically isolated from the active zone, as is the first interconnect from the second main face 13, via isolation material 10, thereby preventing the active zone from short circuiting across the connecting conductor material or the two interconnects from short circuiting across the second main face when the component is activated. In addition, the first and second interconnects are disposed on the side comprising second main face 13 and are spaced apart from each other in the lateral direction.

In contrast to the representation of FIG. 10, the connecting conductor formed by connecting conductor material 8 and/or first interconnect 11 can also be implemented as multilayer. The connecting conductor is preferably implemented as a single layer and/or contains for example Au.

A first interconnect 11, which can include a plurality of interconnect layers, for instance as described above in relation to the second interconnect, is disposed on the connecting conductor on the side nearer second main face 13. Preferably, however, a second interconnect layer of the first interconnect can be omitted, so that disposed after the connecting conductor material on the side nearer the second main face is a first interconnect layer that includes a first sublayer, for example of Ti, and a second sublayer, for example of Al.

The connecting conductor material and/or the interconnects can for example be applied to the composite by means of a liftoff process.

In an ensuing method step, an encapsulating layer 180 is applied to the composite (FIG. 10*i*). In particular, the encapsulating layer 180 is applied to the semiconductor function regions from the side of the composite facing away from the stabilization layer. The encapsulating layer forms around the semiconductor function regions 2. In particular, the encapsulating layer preferably embraces the semiconductor function regions in a pincer-like manner.

Encapsulating layer 180 is preferably implemented as radiation-transparent, since it extends vertically past the region of the active zone 400 and radiation that is to be received or generated by the active zone therefore strikes the encapsulating layer to a greater extent. Absorption losses in encapsulating layer 180 can be reduced in this way.

Encapsulating layer 180, for example a BCB-containing such layer, is preferably applied to the composite, particularly with full coverage, by spin coating and optionally is partially or preferably completely cured, for example by temperature elevation. The encapsulating layer preferably covers the entire side of the composite facing away from the stabilization layer and is in particular disposed in the region of the interspaces 20. Furthermore, encapsulating layer 180 is preferably in direct mechanical contact with adhesion promoting layer 800.

To expose the first interconnect 11 and the second interconnect 12, which may be covered by encapsulating layer 180 applied with full coverage, the encapsulating layer can be removed in the region of the interconnects. This removal can be effected for example by etching, e.g. dry etching with the use of a suitably configured resin mask, for example a metal-containing resin mask, particularly one containing or comprised of aluminum. A particularly suitable etching agent for this purpose is a fluorine-based etchant such as freon.

To create a suitably structured resin mask for the dry etch process, for example an aluminum layer can first be disposed with full coverage on the side of the composite facing away from the stabilization layer, particularly on the encapsulating layer 180. A photoresist layer is then applied to the side of the resin mask facing away from the semiconductor function region and is structured by suitable exposure to light and development such that the regions in which the encapsulating layer is to be removed are free of photoresist. The aluminum layer can then be removed, for example by wet chemical etching, from the regions not covered by photoresist, thus creating the resin mask. The encapsulating layer can thereafter be removed by dry etching from the regions not covered by the resin mask layer. The resin mask is preferably then removed from the composite.

In the exposed regions, solder layers 14 and 15, for example containing Au or Sn or an alloy comprising at least one of these materials, e.g. AuSn, can be applied to the interconnects and are electrically conductively connected to the interconnect concerned. The solder layers can for example be applied by means of a liftoff process.

This can be followed by singulation along lines 21 into ready-to-use, surface-mountable and, particularly hermetically, encapsulated optoelectronic components, which can be connected to an external printed circuit board immediately after being singulated from the wafer composite. The optoelectronic component is implemented in particular as a thin-film component and is produced entirely on the wafer level in the wafer composite. Cost-intensive individual preparatory steps and wire bondings can advantageously be eliminated.

In a preferred variant of the singulation, parting lines are produced during the method that preferably extend from the side of the composite disposed oppositely from the layer stabilizing the composite, in the present exemplary embodiment window layer 170, into the stabilization layer. The parting lines are produced for example in the region of the interspaces 20 and/or by dry etching. In the above described method, such parting lines are preferably configured such that they extend through the encapsulating layer, through the adhesion promoting layer, and into but not all the way through the window layer. The stabilizing effect of the window layer is preferably not adversely affected by these parting lines extending thereinto. For singulation purposes, the layer stabilizing the composite can be thinned on the side opposite from the semiconductor function regions. If the stabilization layer is thinned down to the parting lines, then the wafer composite is singulated into or falls apart into optoelectronic components, since there is no longer any mechanical connection between the individual components. After the creation of the parting lines and prior to singulation, a mechanical connection for the wafer composite was preferably ensured substantially only by the stabilization layer. After the stabilization layer has been thinned down to the parting lines, therefore, the mechanical interconnection of the composite is lacking and individual optoelectronic components are formed. Such a method of separating a composite into individual components is known as "dicing by thinning." The singulation can in particular be performed on a film.

Figure 10J:
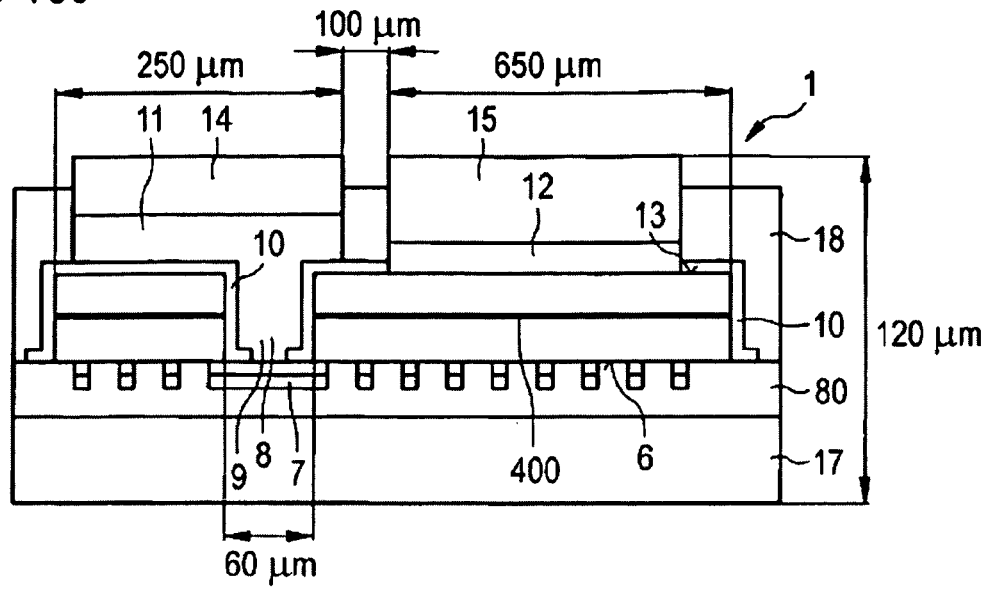
Figure 10K:
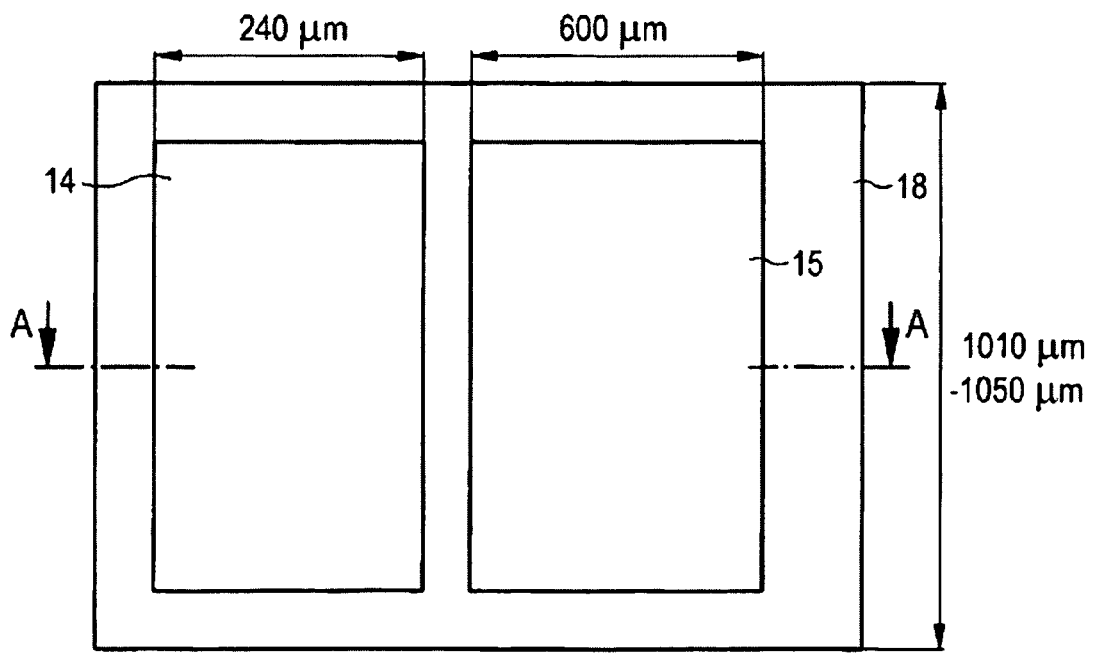

FIGS. 10*j* and 10*k* schematically illustrate such an optoelectronic component 1 after singulation in a sectional view (FIG. 10*j*) and a plan view of the solder layer side. FIG. 10*j* represents a sectional view along line A-A of FIG. 10*k*.

The encapsulation of the active zone 400 of the component is constituted by the portion 80 deriving from adhesion promoting layer 80 on singulation and by the encapsulating element 18 deriving from encapsulating layer 180 on singulation. The window 17 deriving from window layer 170 on singulation preferably stabilizes the component 1 mechanically.

In addition, dimensions of the optoelectronic component, in μm, are provided by way of example in FIGS. 10*j* and 10*k*. The semiconductor function region 2 can be configured as square in plan, with an edge length of 1000 μm, as may be inferred from FIG. 10*j*. The height of the component is for example 120 μm. Based on the plan view of FIG. 10*k*, the edge length of the component as a whole, which can be implemented for example as substantially square, can be 1010 μm to 1050 μm. It goes without saying that the data provided in FIGS. 10*j* and 10*k* are to be construed not as limiting, but only as exemplary.

The first interconnect, the second interconnect and/or the connecting conductor can further be implemented as a mirror layer reflecting the radiation to be generated or received by the component, thereby advantageously increasing the efficiency of the component.

Alternatively or supplementarily to the exemplary embodiment of FIG. 10, more extensive modifications can also be made, for example based on the components, methods or devices described in the previous exemplary embodiments, to arrive at a correspondingly modified method as in FIG. 10.

FIG. 11 shows a fourth exemplary embodiment of an inventive method for producing an optoelectronic component by means of intermediate steps illustrated schematically in FIGS. 11*a* to 11*g*.

A wafer composite is first prepared (FIG. 11a), comprising a semiconductor layer sequence 200 disposed on a carrier layer 300 and having an active zone 400 provided to generate or receive radiation. The wafer composite is configured for example as explained in conjunction with FIG. 10.

Applied to the side of semiconductor function region 200 facing away from carrier layer 300 is a first contact layer 700, preferably comprising a first layer 710 and a second layer 720 (see the explanation of FIG. 10).

Figure 11A:
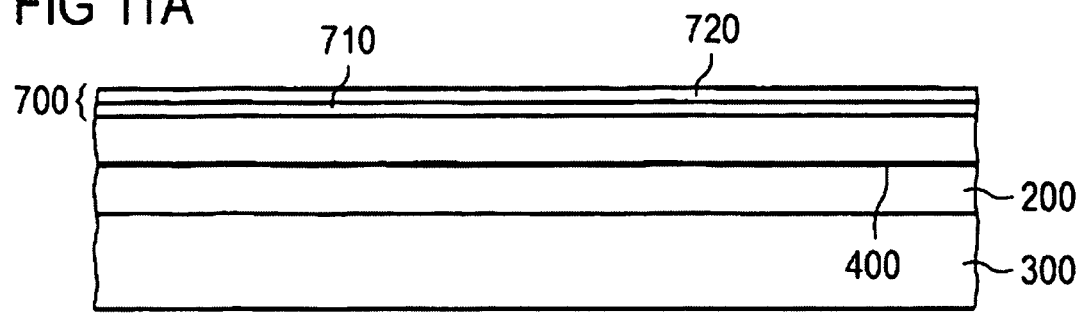
Figure 11B:
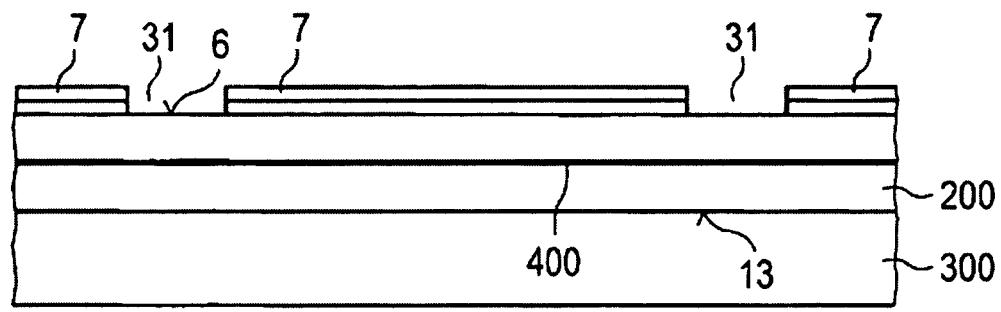

In a succeeding method step, first contact layer 700 is structured into a plurality of regions spatially separated from one another by interspaces 31 (FIG. 11b). Etching and/or backsputtering are particularly suitable for this purpose. During this structuring, particularly the first main face 6 of the semiconductor function region 200, that facing away from the carrier layer, is exposed in the region of the interspaces 31. The subregions of first contact layer 700 form a plurality of first contacts 7 to semiconductor layer sequence 200. Particularly preferably, a first contact 7 is assigned to at least every region of semiconductor layer sequence 200 provided for the creation of a semiconductor function region.

The semiconductor layer sequence is preferably implemented as p-conducting on the side comprising first main face 6 and n-conducting on the side comprising second main face 13, located oppositely from first main face 6 relative to active zone 400. The thickness of the p-conducting side, e.g. 0.5 μm, is preferably smaller than that of the n-conducting side, e.g. 5 μm.

Figure 11C:
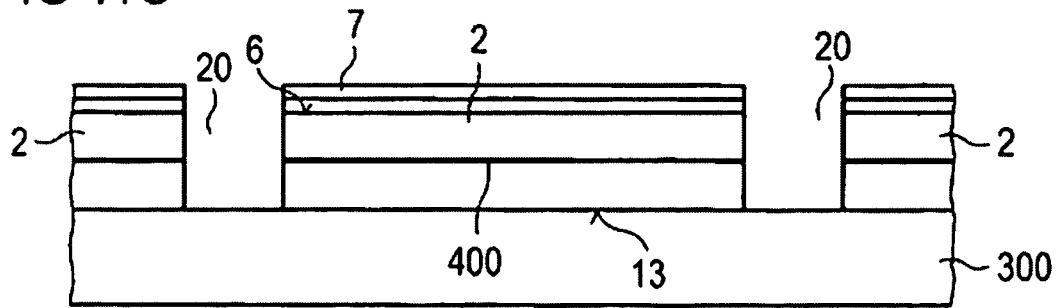
Figure 11D:
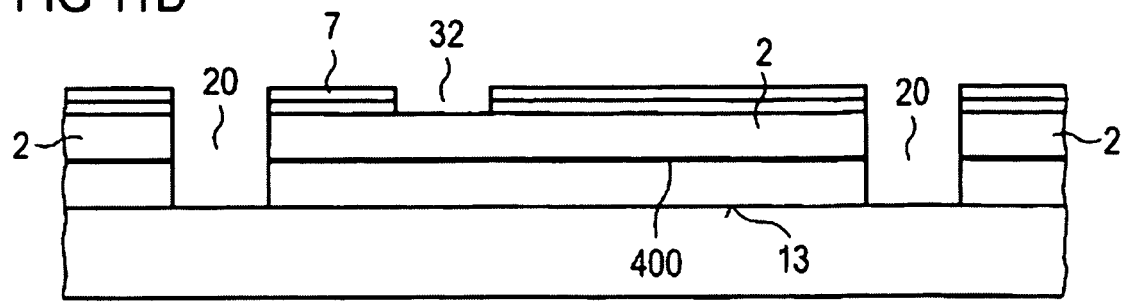
Figure 11E:
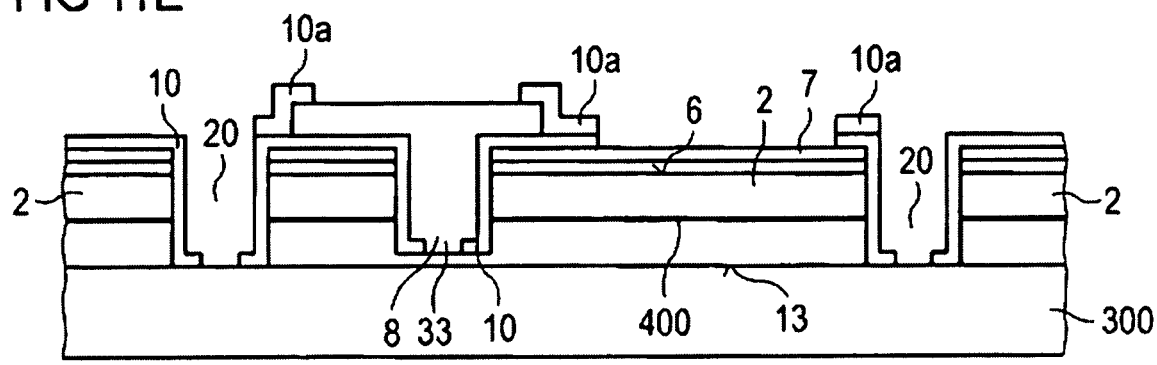

Semiconductor layer sequence 200 is then structured, particularly in the regions divested of first contact layer 700, such as to create a plurality of semiconductor function regions 2 disposed side by side on carrier layer 300 (FIG. 11c). A dry etch process, for example, is particularly suitable for this purpose. The semiconductor function regions 2 are spaced apart from one another by interspaces 20, which can optionally extend into the carrier layer 300.

Subsequently (FIG. 1d), a gap 32 is created in the first contact of the semiconductor function regions. The gap 32 can be made in conjunction with the creation of the interspaces 31 in the first contact layer in a common method step, particularly using a common mask.

Thereafter (FIG. 11e), an opening is made through the active zone 400 of the semiconductor function regions 2. Preferably substantially every semiconductor function region is provided with at least one opening. The opening can be made for example by dry etching. Furthermore, the opening is preferably fashioned as a recess 33 that does not extend vertically all the way through the semiconductor function region 2. The opening is therefore bounded in the vertical direction on the side comprising second main face 13, particularly on the side comprising carrier layer 300, by the semiconductor material of the semiconductor function region. The opening can for example have a diameter of 10 μm.

After the opening has been created, an isolation material 10 is applied to the wafer composite, preferably with full coverage, on the side of the semiconductor function regions facing away from carrier layer 300. The isolation material covers the wall of the opening, particularly in the region of the active zone, but preferably completely.

The isolation material is then removed regionally from the composite. Particularly suitable for this purpose is for example a dry etch process in combination with a suitable mask. On the removal of the isolation material, in the region of the opening, particularly at the bottom of the recess, a semiconductor material of semiconductor function region 2 is exposed that is preferably located on the side of the active zone 400 opposite from the point of penetration of the opening into semiconductor function region 2.

In addition, the isolation material is preferably removed regionally in the region of the interspaces. Carrier layer 300 may be exposed by this operation. Particularly preferably, the isolation material 10 remains on the flanks of the semiconductor function regions and they are therefore protected by the isolation material.

The isolation material 10 further is removed from first contact 7 in an interconnect region that is preferably spaced apart laterally from the opening.

A connecting conductor material 8 is then disposed in the recess 33. The connecting conductor material 8 enters into conductive contact with the semiconductor function region, particularly at the bottom of the recess, in the region of the opening from which the isolation material 10 was removed. The connecting conductor material is electrically isolated from active zone 400 and first main face 6. The recess is preferably filled with connecting conductor material 8 in such fashion that the connecting conductor material substantially completely fills up the recess and is disposed on the side of the isolation material 10 facing away from the semiconductor function region, on the first main face of the semiconductor function region. The lateral extent of the connecting conductor material on the side nearer the first main face is preferably greater than the lateral extent of the opening.

Thereafter, an additional isolation material 10a is applied, preferably with full coverage, to the composite on the side thereof facing away from the carrier layer 300 that mechanically stabilizes the composite. Isolation material 10a is then preferably removed regionally such that first contact 7 is re-exposed, particularly in the interconnect region from which isolation material 10 was already previously removed. In addition, isolation material 10a is removed from the connecting conductor to render it accessible for further processing.

Additional isolation material 10a preferably extends in the vertical direction along the edge of the connecting conductor material. Additional isolation material 10a is preferably in direct mechanical contact with isolation material 10 in the region of the connecting conductor.

Figure 11F:
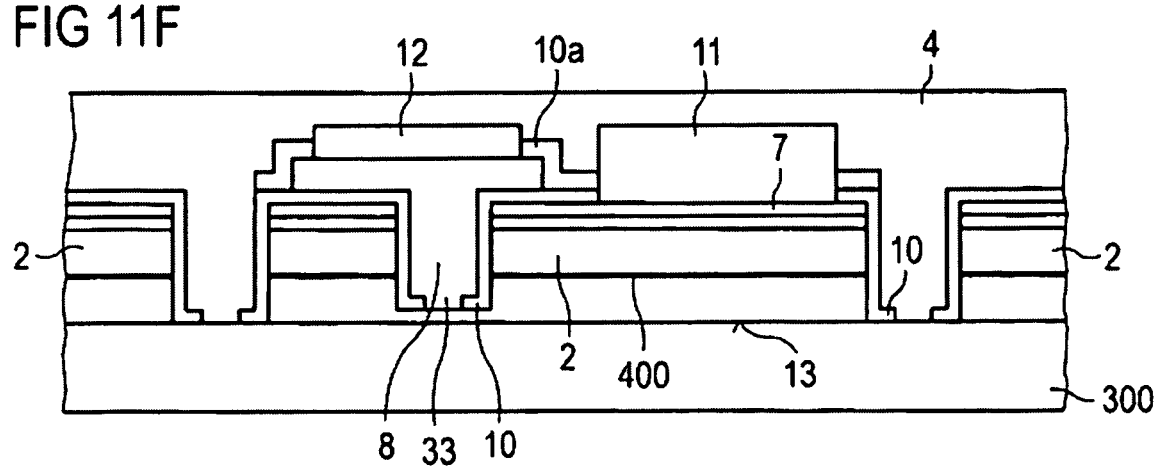

A first interconnect 11 and a second interconnect 12 are then applied to the semiconductor function regions 2 of the composite such that in the interconnection region first interconnect 11 is electrically conductively connected, particularly directly, to first contact 7, as is second interconnect 12 to connecting conductor material 8 (FIG. 11f). Preferably only the subregion of the first contact layer provided for contacting with the first interconnect 11 is devoid of isolation materials 10 and/or 10a. The remaining region of first contact 7 can be covered with isolation material 10 and/or 10a. The second interconnect 12 can therefore advantageously be given a larger area than the connecting conductor on the side nearer first main face 6 and is electrically isolated from first contact 7 and from first interconnect 11 respectively by isolation material 10 and/or 10a. In particular, the first and/or second interconnects 12 can thus be given a track-like interconnection structure without significantly increasing the risk of a short circuit.

An envelope 4 is thereafter applied to the composite from the side thereof facing away from carrier layer 300. The envelope is for example spin-coated on and/or contains BCB. After being applied, the envelope can be cured for example by heating, particularly in an oven. The envelope 4 preferably covers the composite, particularly preferably completely.

Figure 11G:
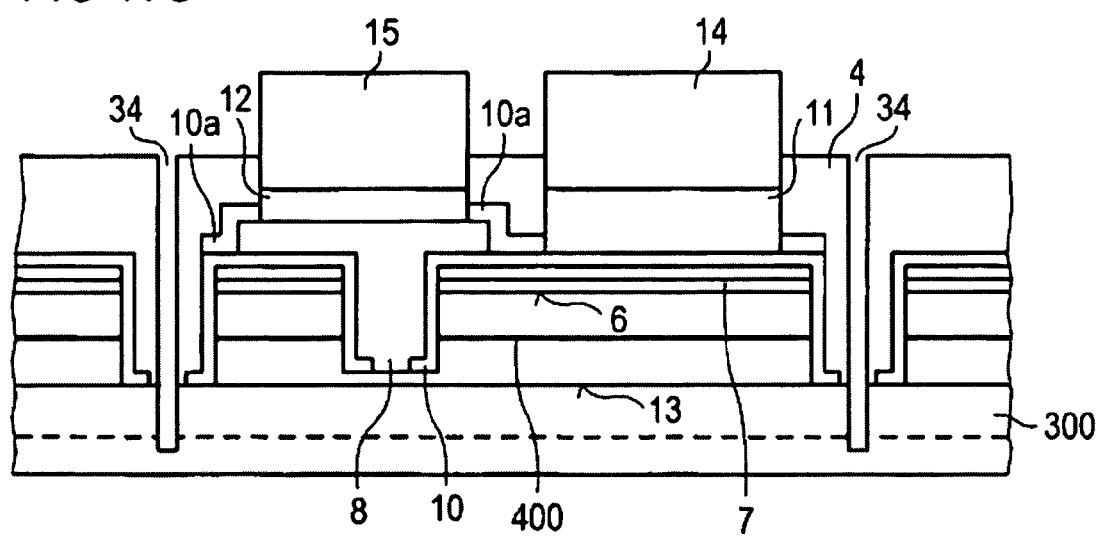

The envelope 4 can then be structured such that first interconnect 11 and second interconnect 12 are exposed (FIG. 11g).

The procedure used here can be for example the structuring of encapsulating layer 180 as described in connection with FIG. 10.

In addition, parting lines 34 are preferably formed that extend from the side of envelope 4 facing away from the carrier layer on into the carrier layer 300 stabilizing the composite. The parting lines preferably do not penetrate all the way through the carrier layer, however. In particular, the carrier layer continues to ensure the mechanical stability of the composite. The parting lines 34 are usefully produced in a common method step, particularly using a common mask, with the exposure of the first and second interconnects.

Solder layers 14 and 15 are subsequently applied to first interconnect 11 and second interconnect 12.

Thereafter, the carrier layer 300 can be thinned down from its side facing away from the semiconductor function regions 2 on through to the parting lines 34 or thereinto, e.g. to the broken line in FIG. 11g, thereby singulating the composite into optoelectronic components. To this end, the parting lines are preferably disposed so that they extend around the semiconductor function regions 2.

The singulation can optionally also be performed by sawing or breaking.

The carrier layer 300 is preferably transparent to the radiation to be generated in or received by the active zone 400. Sapphire, for example, is inexpensive and radiation-transparent, particularly for radiation generated by GaN-based semiconductors. Radiation can therefore be coupled into or out of the component through the carrier layer or a carrier layer portion formed therefrom upon singulation.

Particularly advantageously, the first contact, the first interconnect, the second interconnect and/or the connecting conductor material can be implemented as reflective of radiation generated in or received by the active zone. The efficiency of the optoelectronic component can be further increased in this way. The aforesaid elements, particularly the first contact, can thus be implemented as a mirror layer.

The isolation materials and/or the envelope are preferably radiation-transparent.

In the method described in conjunction with FIG. 11 it is not absolutely necessary to remove carrier layer 300, so the method step for removing the carrier layer can be eliminated. Due to the smaller number of steps, the method not entailing the removal of the carrier layer is advantageously less costly than a method in which the carrier layer is removed.

Alternatively or supplementarily to the exemplary embodiment according to FIG. 11, more extensive modifications can be made, for example based on the components, methods or devices described in the previous exemplary embodiments, to arrive at a correspondingly modified method as in FIG. 11.

The present patent application claims the priority of German Patent Application DE 10 2004 008 853.5 of Feb. 20, 2004, whose entire disclosure content is hereby explicitly incorporated by reference into the present patent application.

The invention is not limited by the description thereof with reference to the exemplary embodiments. Rather, the invention encompasses any novel feature and any combination of features, including in particular any combination of features recited in the claims, even if that feature or combination itself is not explicitly stated in the claims or exemplary embodiments.

The invention claimed is:

1. An optoelectronic component, comprising:
a semiconductor function region with an active zone and a lateral main direction of extension, wherein said semiconductor function region is provided with at least one opening extending through said active zone in a direction orthogonal to the main direction, wherein the semiconductor function region with the active zone is a radiation-emitting or radiation-receiving component, and wherein the active zone is configured to generate at least one of electroluminescent radiation and an electrical signal when incident radiation generates charge carriers in the active zone;
a connecting conductor material that is disposed in the region of said opening and electrically isolated from said active zone at least in a subregion of said opening;
a carrier, wherein the semiconductor function region is supported by the carrier; and
a mirror layer arranged between the semiconductor function region and the carrier,
wherein the opening penetrates through the mirror layer; and
wherein the opening is completely surrounded and bounded in the lateral direction by the mirror layer in a region where the opening penetrates through the mirror layer.

2. A device comprising a plurality of optoelectronic components as in claim 1, wherein said semiconductor function regions are disposed at least partially side by side in the lateral direction.

3. The device as in claim 2, wherein an envelope forms at least partially around said semiconductor function regions, and wherein said envelope is configured in one piece.

4. The device as in claim 3, wherein said semiconductor function regions are mechanically stabilized by a stabilization layer.

5. The device as in claim 4, wherein said envelope is configured as said stabilization layer or part of said stabilization layer.

6. The device as in claim 2, wherein said device can be fabricated in the wafer composite.

7. The optoelectronic component as in claim 1, wherein said connecting conductor material is at least partially electrically isolated from said active zone by an isolation material.

8. The optoelectronic component as in claim 7, wherein said isolation material at least partially lines said opening.

9. The optoelectronic component as in claim 1, wherein said semiconductor function region comprises a first main face and a second main face located oppositely from said first main face relative to said active zone, and said semiconductor function region is connected electrically conductively to said connecting conductor material on a side comprising said first main face.

10. The optoelectronic component as in claim 9, wherein said connecting conductor material is electrically isolated from said second main face of said semiconductor function region.

11. The optoelectronic component as in claim 1, wherein a lateral dimension of said opening is equal to 100 µm or less.

12. The optoelectronic component as in claim 1, wherein an envelope forms at least partially around said semiconductor function region.

13. The optoelectronic component as in claim 12, wherein said envelope is transparent to radiation to be generated or received by said active zone.

14. The optoelectronic component as in claim 1, wherein said active zone is surrounded by an encapsulation that is substantially hermetically tight.

15. The optoelectronic component as in claim 1, wherein said connecting conductor material extends to a side of said carrier that is opposite said semiconductor function region.

16. The optoelectronic component as in claim 1, wherein said component can be fabricated in the wafer composite.

17. The optoelectronic component as in claim 1, wherein the opening extends entirely through said active zone.

18. The optoelectronic component as in claim 1, wherein the opening is configured in the form of a gap that penetrates all the way through the semiconductor function region, and wherein the gap is completely surrounded in the lateral direction and bounded laterally by the semiconductor function region.

19. An optoelectronic component, comprising:
- a semiconductor function region with an active zone and a lateral main direction of extension, wherein said semiconductor function region is provided with at least one opening extending through said active zone in a direction orthogonal to the main direction, wherein the semiconductor function region with the active zone is a radiation-emitting or radiation-receiving component, and wherein the active zone is configured to generate at least one of electroluminescent radiation and an electrical signal when incident radiation generates charge carriers in the active zone;
- a connecting conductor material that is disposed in the region of said opening and electrically isolated from said active zone at least in a subregion of said opening;
- a carrier, wherein the semiconductor function region is supported by the carrier; and
- a mirror layer arranged between the semiconductor function region and the carrier, wherein the opening penetrates through the mirror layer; and
wherein the connecting conductor material extends through the mirror layer within the opening.

20. A device, comprising:
an optoelectronic component comprising:
- a semiconductor function region with an active zone and a lateral main direction of extension, wherein said semiconductor function region is provided with at least one opening extending through said active zone in a direction orthogonal to the main direction, wherein the semiconductor function region with the active zone is a radiation-emitting or radiation-receiving component, and wherein the active zone is configured to generate at least one of electroluminescent radiation and an electrical signal when incident radiation generates charge carriers in the active zone;
- a connecting conductor material that is disposed in the region of said opening and electrically isolated from said active zone at least in a subregion of said opening;
- a carrier, wherein the semiconductor function region is supported by the carrier; and
- a mirror layer arranged between the semiconductor function region and the carrier, wherein the opening penetrates through the mirror layer; and
lead electrodes that are separate from the carrier and electrically connected to the optoelectronic component.

* * * * *